United States Patent
Ueda

(10) Patent No.: US 9,082,652 B2
(45) Date of Patent: Jul. 14, 2015

(54) SEMICONDUCTOR DEVICE, ACTIVE MATRIX SUBSTRATE, AND DISPLAY DEVICE

(75) Inventor: Naoki Ueda, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 283 days.

(21) Appl. No.: 13/636,536

(22) PCT Filed: Nov. 4, 2010

(86) PCT No.: PCT/JP2010/069611
§ 371 (c)(1),
(2), (4) Date: Sep. 21, 2012

(87) PCT Pub. No.: WO2011/118076
PCT Pub. Date: Sep. 29, 2011

(65) Prior Publication Data
US 2013/0009163 A1    Jan. 10, 2013

(30) Foreign Application Priority Data
Mar. 23, 2010  (JP) ................. 2010-065644

(51) Int. Cl.
*H01L 27/115* (2006.01)
*H01L 27/12* (2006.01)
*H01L 29/94* (2006.01)
*G11C 16/34* (2006.01)

(52) U.S. Cl.
CPC ...... *H01L 27/11521* (2013.01); *G11C 16/3418* (2013.01); *H01L 27/1156* (2013.01); *H01L 27/11519* (2013.01); *H01L 27/1214* (2013.01); *H01L 29/94* (2013.01)

(58) Field of Classification Search
CPC .................................................... H01L 27/1156
USPC .......................................................... 257/315
See application file for complete search history.

(56) References Cited

U.S. PATENT DOCUMENTS

2002/0113268 A1    8/2002   Koyama et al.
2009/0278188 A1    11/2009  Asami

FOREIGN PATENT DOCUMENTS

JP      2001-298100 A    10/2001
JP      2009-123877 A    6/2009

(Continued)

OTHER PUBLICATIONS

EPO machine translation of JP2009231621.*

(Continued)

*Primary Examiner* — Peniel M Gumedzoe
*Assistant Examiner* — Christopher Johnson
(74) *Attorney, Agent, or Firm* — Chen Yoshimura LLP

(57) ABSTRACT

A semiconductor device that includes a substrate 37, a non-volatile memory (memory cell) 21 having a memory cell transistor (switching element) 33 and a floating gate electrode (memory storage part) 36, and a passivation insulating film (insulating layer) 40 and an organic polymer film (insulating layer) 41 both provided above the non-volatile memory 21, in which conductive wiring line layers (shielding part) 5a to 5c for shielding the floating gate electrode 36 are provided between the floating gate electrode 36 and both the passivation insulating film 40 and the organic polymer film 41 so that ions generated from the passivation insulating film 40 and the organic polymer film 41 can be prevented from reaching the floating gate electrode 36.

8 Claims, 33 Drawing Sheets

(56) References Cited

FOREIGN PATENT DOCUMENTS

| JP | 2009-194140 A | | 8/2009 | |
| JP | 2009-231621 A | | 10/2009 | |
| JP | 2009231621 A | * | 10/2009 | .............. H01L 27/10 |
| JP | 2009-295971 A | | 12/2009 | |

OTHER PUBLICATIONS

Machine translation of Oka (JP 2009-194140). The machine-translation produced by ESPACENET.*

Machine translation of Oka (JP 2009-231621), (Aug. 27, 2009). The machine-translation produced by ESPACENET.*

* cited by examiner

SEMICONDUCTOR DEVICE, ACTIVE MATRIX SUBSTRATE, AND DISPLAY DEVICE

TECHNICAL FIELD

The present invention relates to a semiconductor device provided with a non-volatile memory having switching elements such as transistors, and an active matrix substrate and a display device that use the same.

BACKGROUND ART

In recent years, liquid crystal display devices, for example, are being widely used in liquid crystal televisions, monitors, mobile telephones, and the like, as flat panel displays having advantages such as being thinner and lighter compared to previously existing cathode-ray tube displays. Among such liquid crystal display devices, one is known in which the liquid crystal panel, which functions as the display panel, includes an active matrix substrate that has a plurality of data wiring lines (source wiring lines) and a plurality of scan wiring lines (gate wiring lines) wired in a matrix form, and a plurality of pixels, each of which is provided with a switching element such as a thin film transistor (TFT) and a pixel electrode connected to the switching element, arranged in a matrix in the vicinity of the respective intersections of the data wiring lines and the scan wiring lines.

For an active matrix substrate such as the one described above, one in which a plurality of non-volatile memories that can store data are provided aside from the pixels is proposed. In such an active matrix substrate, switching elements such as thin film transistors for selection are provided in order to select each of the plurality of non-volatile memories. In other words, such an active matrix substrate uses a semiconductor device provided with the non-volatile memories having a plurality of thin film transistors for selection.

Among conventional semiconductor devices, it has been proposed that thin film transistors for pixels and thin film transistors for selection be formed on a substrate in the same process, and the thin film transistors for the pixels and non-volatile memories be also provided together on the same substrate, as disclosed in Patent Document 1 to be mentioned below, for example.

RELATED ART DOCUMENTS

Patent Documents
Patent Document 1: Japanese Patent Application Laid-Open Publication No. 2009-123877

SUMMARY OF THE INVENTION

Problems to be Solved by the Invention

However, the conventional semiconductor devices such as those described above sometimes had a problem that the storability of data in the non-volatile memories cannot be maintained.

Specifically, in such conventional semiconductor devices, each of the parts of the non-volatile memories is protected and the part above the non-volatile memories is made flat by providing an insulating layer containing an inorganic insulating film such as silicon oxide and an organic polymer film such as acrylic in the part above the non-volatile memory.

However, the above-mentioned insulating layer contains impurities including water and mobile ions such as hydrogen ions, and in the conventional semiconductor device, such impurities sometimes reached the charge storage part (memory storage part) provided in the non-volatile memories. As a result, in conventional semiconductor devices, the impurities sometimes cancelled the charge (electrons) or holes stored in the charge storage parts, which meant that the data present during the reading time of the non-volatile memory sometimes did not accurately correspond to the data written in. In this way, conventional semiconductor devices had a problem that the storability of data in the non-volatile memories cannot be maintained.

In consideration of the above-mentioned problem, the present invention aims to provide a semiconductor device that can maintain the storability of data, and an active matrix substrate and a display device that use the same.

Means for Solving the Problems

In order to achieve the above-mentioned objectives, a semiconductor device according to the present invention includes: a substrate; a non-volatile memory that has a switching element provided on a main surface of the substrate and a memory storage part provided on the main surface of the substrate to store data; an insulating layer provided above the non-volatile memory; and a shielding part provided between the memory storage part and the insulating layer, the shielding part being provided to shield the memory storage part such that impurities from the insulating layer are prevented from reaching the memory storage part.

In a semiconductor device with the above configuration, the shielding part that shields the memory storage part is provided between the memory storage part and the insulating layer so as to prevent impurities from the insulating layer from reaching the memory storage part. As a result, impurities including water and mobile ions such as hydrogen ions, which exist inside the insulating layer, can be prevented from reaching the memory storage part. As a result, unlike the conventional examples mentioned above, a semiconductor device that can maintain the storability of data can be configured.

In the above-mentioned semiconductor device, it is preferable for the following inequality (1) to be fulfilled:

$$L/T \geq 5 \qquad (1),$$

where L is a protruding dimension of the shielding part with respect to the memory storage part, and T is a distance between the memory storage part and the shielding part in a perpendicular direction to the main surface of the substrate.

In this case, the impurities described above can be effectively prevented from reaching the memory storage part.

In the semiconductor device, the shielding part may be provided with an opening that is 5% to 20% of the shielding area.

In this case, deletion of stored data using ultraviolet light can be performed easily while preventing a decrease in the shielding effect by the shielding part.

In the semiconductor device, it is preferable for a wiring line layer connected to the non-volatile memory to be used as the shielding part, and for a charge storage part that stores data corresponding to the amount of charge stored to be used as the memory storage part.

In this case, a semiconductor device that is compact and has a simple structure can be easily configured.

In the semiconductor device, the non-volatile memory may include a memory cell transistor and a MOS capacitor, and the gate electrode of the memory cell transistor and the gate electrode of the MOS capacitor may be shared as a floating gate electrode in a floating state, and the floating gate electrode may be used as the memory storage part.

In this case, it is possible to maintain the storability of data in the floating gate electrode.

In the semiconductor device, the non-volatile memory may include a reading memory cell transistor, a writing memory cell transistor, and a MOS capacitor, and the gate electrode of the reading memory cell transistor, the gate electrode of the writing memory cell transistor and the gate electrode of the MOS capacitor may be shared as a floating gate electrode in a floating state, and the floating gate electrode may be used as the memory storage part.

In this case, the reading memory cell transistor and the writing memory cell transistor are provided independent of each other; therefore, a non-volatile memory having excellent reliability can be configured.

In the semiconductor device, it is preferable that, in the non-volatile memory, a semiconductor layer of the MOS capacitor be provided below the floating gate electrode, a conductive wiring line layer that is connected to a control gate of the non-volatile memory be provided above the floating gate electrode, and the semiconductor layer and the conductive wiring line layer be electrically connected to each other so as to have the same potential.

In this case, the capacitance of the non-volatile memory can be made large, and it is possible to reduce the potential of the control gate and reduce the voltage of the non-volatile memory.

In the semiconductor device, the non-volatile memory may include a memory cell transistor, and a trap insulating film may be provided between the semiconductor layer and the gate electrode of the memory cell transistor as the memory storage part.

In this case, the storability of data in the trap insulating film can be maintained. Also, an easy-to-manufacture semiconductor device can be configured.

In the semiconductor device, it is preferable for two of the aforementioned trap insulating films to be provided for each semiconductor layer and for the semiconductor layer to be shared between two memory cell transistors.

In this case, miniaturization of the semiconductor device provided with a plurality of non-volatile memories is easy.

In the semiconductor device, the non-volatile memory may include a memory cell transistor and a MOS capacitor, and the gate electrode of the memory cell transistor and the gate electrode of the MOS capacitor may be provided below respective semiconductor layers of the memory cell transistor and the MOS capacitor, may be shared as a floating gate electrode in a floating state, and the floating gate electrode may be used as the memory storage part.

In this case, a bottom gate non-volatile memory can be configured.

In the semiconductor device, the non-volatile memory may include a memory cell transistor and an inter-electrode capacitor, the gate electrode of the memory cell transistor and the gate electrode of the inter-electrode capacitor may be provided below the semiconductor layer of the memory cell transistor and shared as a floating gate electrode in a floating state, and the floating gate electrode may be used as the memory storage part, and the floating gate electrode and a conductive wiring line layer connected to the control gate of the non-volatile memory may be capacitively coupled to each other in the inter-electrode capacitor.

In this case, an easy-to-manufacture bottom gate non-volatile memory with a simplified structure, can be configured.

An active matrix substrate of the present invention uses any one of the above-mentioned semiconductor devices.

In an active matrix substrate configured in the above-mentioned way, a semiconductor device that can maintain the storability of data can be used; therefore, a high performance active matrix substrate that can store data can be easily configured.

A display device of the present invention includes: a display part that displays data; and any one of the above-mentioned semiconductor devices.

In a display device configured in the above-mentioned way, a semiconductor device that can maintain the storability of data is used; therefore, a high performance display device that can store data can be easily configured.

In the display device, a liquid crystal panel may be used as the display part.

In this case, a high performance liquid crystal display device that can store data can be easily configured.

In the display device, the non-volatile memory may be provided per pixel unit of the liquid crystal panel.

In this case, a high performance liquid crystal display device with a large storage capacity of data can be easily configured.

Effects of the Invention

According to the present invention, a semiconductor device that can maintain the storability of data, and an active matrix substrate and a display device that use the same can be provided.

DETAILED DESCRIPTION OF EMBODIMENTS

Preferred embodiments of the semiconductor device, the active matrix substrate, and the display device of the present invention will be described below with reference to the drawings. In the description below, cases in which the present invention is applied to an active matrix substrate of a liquid crystal display device are shown as examples. The dimensions of the components within each drawing do not faithfully reflect the actual dimension of the components, the ratio of dimensions of each of the components, or the like.

Embodiment 1

Figure 1:
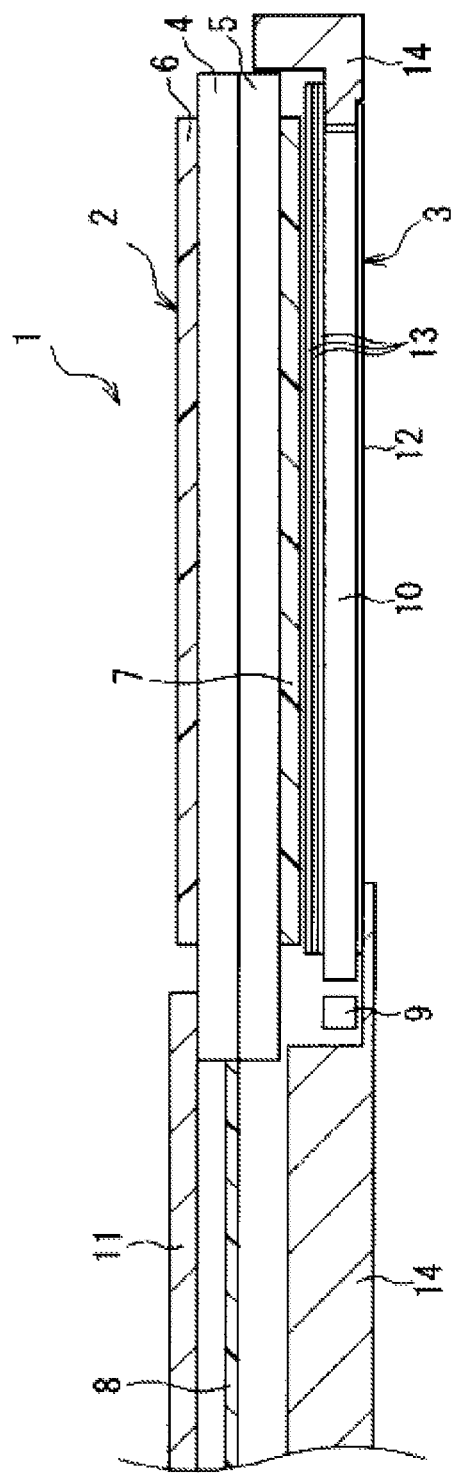
FIG. 1 is a drawing that describes a liquid crystal display device according to Embodiment 1 of the present invention.

FIG. 1 is a drawing showing a liquid crystal display device of Embodiment 1 of the present invention. In FIG. 1, a liquid crystal display device 1 of the present embodiment is provided with a liquid crystal panel 2 provided such that the upper side of FIG. 1 is the viewer side (display surface side), and a backlight device 3 that is disposed on the non-display surface side (lower side of FIG. 1) of the liquid crystal panel 2 and that emits an illumination light for illuminating the liquid crystal panel 2.

The liquid crystal panel 2 is provided with a color filter substrate 4 and an active matrix substrate 5 of the present invention, which constitute a pair of substrates, and polarizing plates 6 and 7, which are provided on the outer surfaces of the color filter substrate 4 and the active matrix substrate 5, respectively. A liquid crystal layer, which is omitted from the drawings, is sandwiched between the color filter substrate 4 and the active matrix substrate 5. The color filter substrate 4 and the active matrix substrate 5 are made of a planar transparent glass material or a transparent synthetic resin such as an acrylic resin. Resin films such as triacetyl cellulose (TAC) or polyvinyl alcohol (PVA) are used for the polarizing plates 6 and 7, and the polarizing plates are bonded together to the corresponding color filter substrate 4 or active matrix substrate 5 so as to cover at least the active display region of the display surface provided on the liquid crystal panel 2.

The active matrix substrate 5 constitutes one of the pair of substrates, and pixel electrodes, thin film transistors (TFT), and the like are formed between the active matrix substrate 5 and the liquid crystal layer to correspond to the plurality of pixels included in the display surface of the liquid crystal panel 2. The active matrix substrate 5 is also used as a substrate for a semiconductor device of the present invention, and a memory cell (non-volatile memory) that uses the semiconductor device is provided integrally with the pixel electrodes and the like, in the active matrix substrate 5 (details to follow). The color filter substrate 4 constitutes the other of the pair of substrates, and color filters, an opposite electrode, and the like are formed between the color filter substrate 4 and the liquid crystal layer (not shown in drawings).

The liquid crystal panel 2 is provided with an FPC (flexible printed circuit) 8 that is connected to a control device (not shown in drawings) that conducts driving control of the liquid crystal panel 2, and displays desired images on the display surface by driving the display surface per pixel unit by operating the liquid crystal layer per pixel unit.

The liquid crystal mode and the pixel configuration of the liquid crystal panel 2 can be appropriately selected. The driving mode of the liquid crystal panel 2 can also be appropriately selected. In other words, any liquid crystal panel that can display data can be used for the liquid crystal panel 2. Therefore, a detailed configuration of the liquid crystal panel 2 is not shown in FIG. 1 and descriptions thereof will be omitted.

The backlight device 3 is provided with a light-emitting diode 9 as a light source, and a light guide plate 10 disposed facing the light-emitting diode 9. In the backlight device 3, the liquid crystal panel 2 is provided above the light guide plate 10, and the light-emitting diode 9 and the light guide plate 10 are sandwiched by a bezel 14, which has an L-shaped cross-section. A case 11 is installed on the color filter substrate 4. As a result, the backlight device 3 is mounted to the liquid crystal panel 2, and the two components are held as a single unit as a transmissive liquid crystal display device 1 in which illumination light from the backlight device 3 is radiated into the liquid crystal panel 2.

A synthetic resin such as a transparent acrylic resin, for example, is used for the light guide plate 10, and light enters the light guide plate 10 from the light-emitting diode 9. The side opposite to the liquid crystal panel 2 (opposite surface side) of the light guide plate 10 is provided with a reflective sheet 12. The liquid crystal panel 2 side of the light guide plate 10 (light-emitting side) is provided with optical sheets 13 such as a lens sheet and a diffusion sheet. Light from the light-emitting diode 9, which is guided through the inside of the light guide plate 10 in a prescribed light guide direction (left to right direction in FIG. 1), is radiated onto the liquid crystal panel 2 after being converted to a planar illumination light with an even brightness.

In the above description, a configuration that uses an edge light-type backlight device 3 that has a light guide plate 10 was described, but the present embodiment is not limited thereto and a direct backlight device may be used. Also, a backlight device that has another type of light source other than a light-emitting diode such as a cold cathode fluorescent lamp or a hot cathode fluorescent lamp can be used.

Next, the liquid crystal panel 2 of the present embodiment will be described in detail with reference to FIG. 2.

Figure 2:
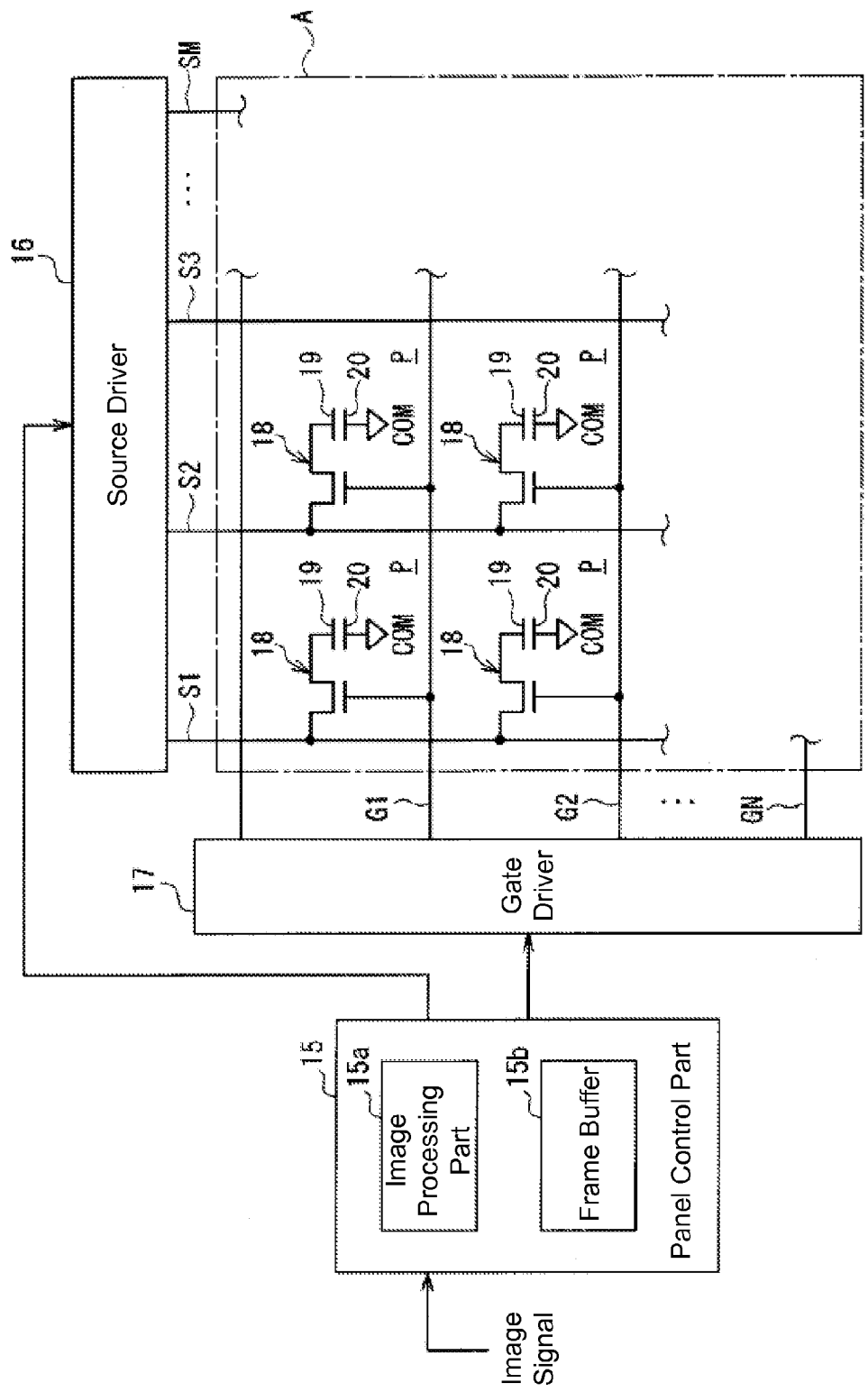
FIG. 2 is a drawing that describes a configuration of a liquid crystal panel shown in FIG. 1.

FIG. 2 is a drawing that shows the configuration of the liquid crystal panel shown in FIG. 1.

In FIG. 2, the liquid crystal display device 1 (FIG. 1) is provided with a panel control part 15 that conducts drive control of the liquid crystal panel 2 (FIG. 1) that functions as the display part that displays data such as characters and images, and a source driver 16 and a gate driver 17 that operate based on command signals from the panel control part 15.

The panel control part 15 is provided within the control device, and an image signal from the outside the liquid crystal display device 1 is inputted to the panel control part 15. The panel control part 15 is provided with an image processing part 15a that conducts a prescribed image processing to the inputted image signal, and generates command signals to the source driver 16 and the gate driver 17, and a frame buffer 15b that can store one frame of display data included in the inputted image signal. The panel control part 15 conducts drive control on the source driver 16 and the gate driver 17 based on the inputted image signal, and thus, data based on the image signal is displayed in the liquid crystal panel 2.

The source driver 16 and the gate driver 17 are provided on the active matrix substrate 5. Specifically, the source driver 16 is provided along the horizontal direction of the liquid crystal panel 2 in the outer region of an active display region A of the liquid crystal panel 2 that acts as the display panel, on the surface of the active matrix substrate 5. The gate driver 17 is provided along the vertical direction of the liquid crystal panel 2 in the outer region of the active display region A, on the surface of the active matrix substrate 5. Memory cells using the semiconductor device of the present invention are arranged in a matrix form in the outside of the active display region A, as will be described in detail below.

The source driver 16 and the gate driver 17 are driver circuits that drive the plurality of pixels P provided in the liquid crystal panel 2 per pixel unit, and the source driver 16 and the gate driver 17 are connected to a plurality of source wiring lines S1 to SM (M represents an integer of at least two; hereinafter collectively referred to as S) and a plurality of gate wiring lines G1 to GN (N represents an integer of at least two; hereinafter collectively referred to as G), respectively. These source wiring lines S and gate wiring lines G respectively constitute data wiring lines and scan wiring lines, and are arranged in a matrix form so as to intersect with each other on a transparent glass member or a transparent synthetic resin member (not shown in drawings) included in the active matrix substrate 5.

In the vicinity of the intersections of the source wiring lines S and the gate wiring lines G, the pixels P that respectively have thin film transistors 18 that function as switching elements and pixel electrodes 19 connected to the thin film transistors 18 are provided. In each pixel P, a common electrode 20 is configured so as to face a pixel electrode 19, sandwiching the liquid crystal layer provided in the liquid crystal panel 2 therebetween. In other words, a thin film transistor 18, a pixel electrode 19, and a common electrode 20 are provided per pixel unit in the active matrix substrate 5.

In the active matrix substrate 5, a plurality of regions for the respective pixels P are respectively formed in regions that are divided by the source wiring lines S and the gate wiring lines G in a matrix form. These plurality of pixels P include pixels of red (R), green (G), and blue (B). These RGB pixels are sequentially arranged in this order, for example, parallel to each gate wiring line G1 to GN. These RGB pixels can display corresponding colors as a result of a color filter layer (not shown in drawings) provided in the color filter substrate 4.

In the active matrix substrate 5, the gate driver 17 sequentially outputs a scanning signal (gate signal) to the gate wiring lines G1 to GN to put the gate electrodes of the corresponding thin film transistors 18 in the ON state, based on a command signal from the image processing part 15a. The source driver 16 outputs data signals (voltage signals (gradation voltages)), which correspond to the display image brightness (gradation), to the corresponding source wiring lines S1 to SM, based on a command signal from the image processing part 15a.

Next, a semiconductor device provided in the active matrix substrate 5 of the present embodiment will be described in detail with reference to FIGS. 3, 4, 5, 6A, 6B, and 6C.

Figure 3:
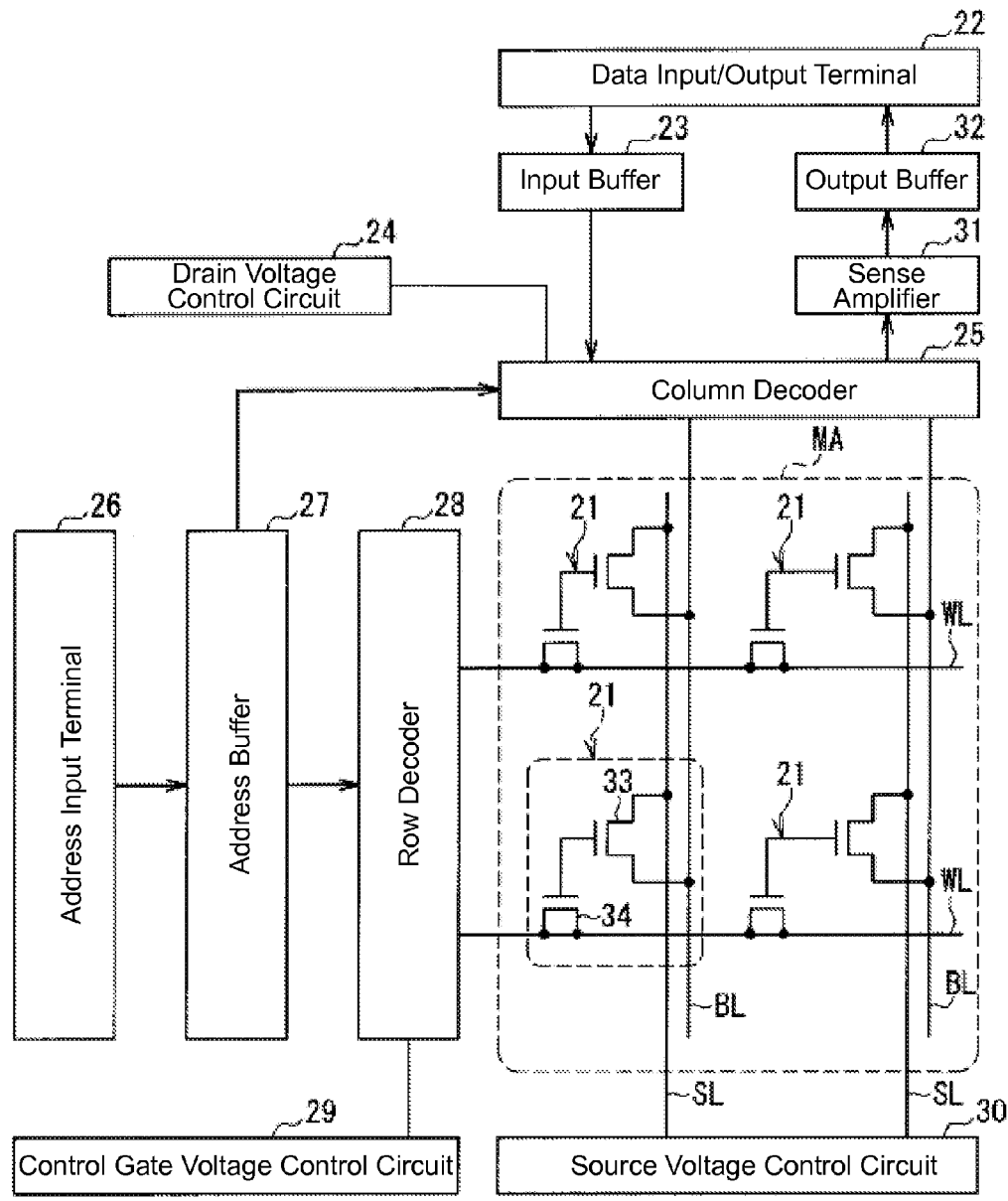
FIG. 3 is a drawing that describes a configuration of an entire semiconductor device according to Embodiment 1 of the present invention.
Figure 4:
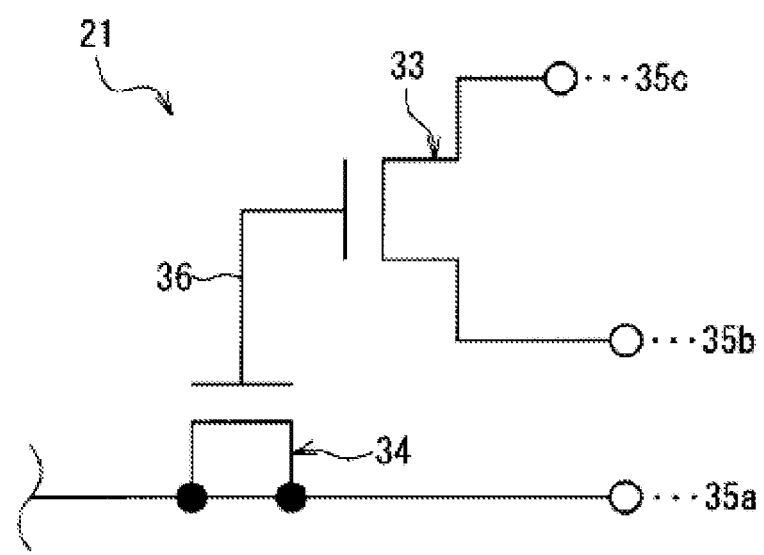
FIG. 4 is a circuit diagram that shows an equivalent circuit of a memory cell shown in FIG. 3.
Figure 5:
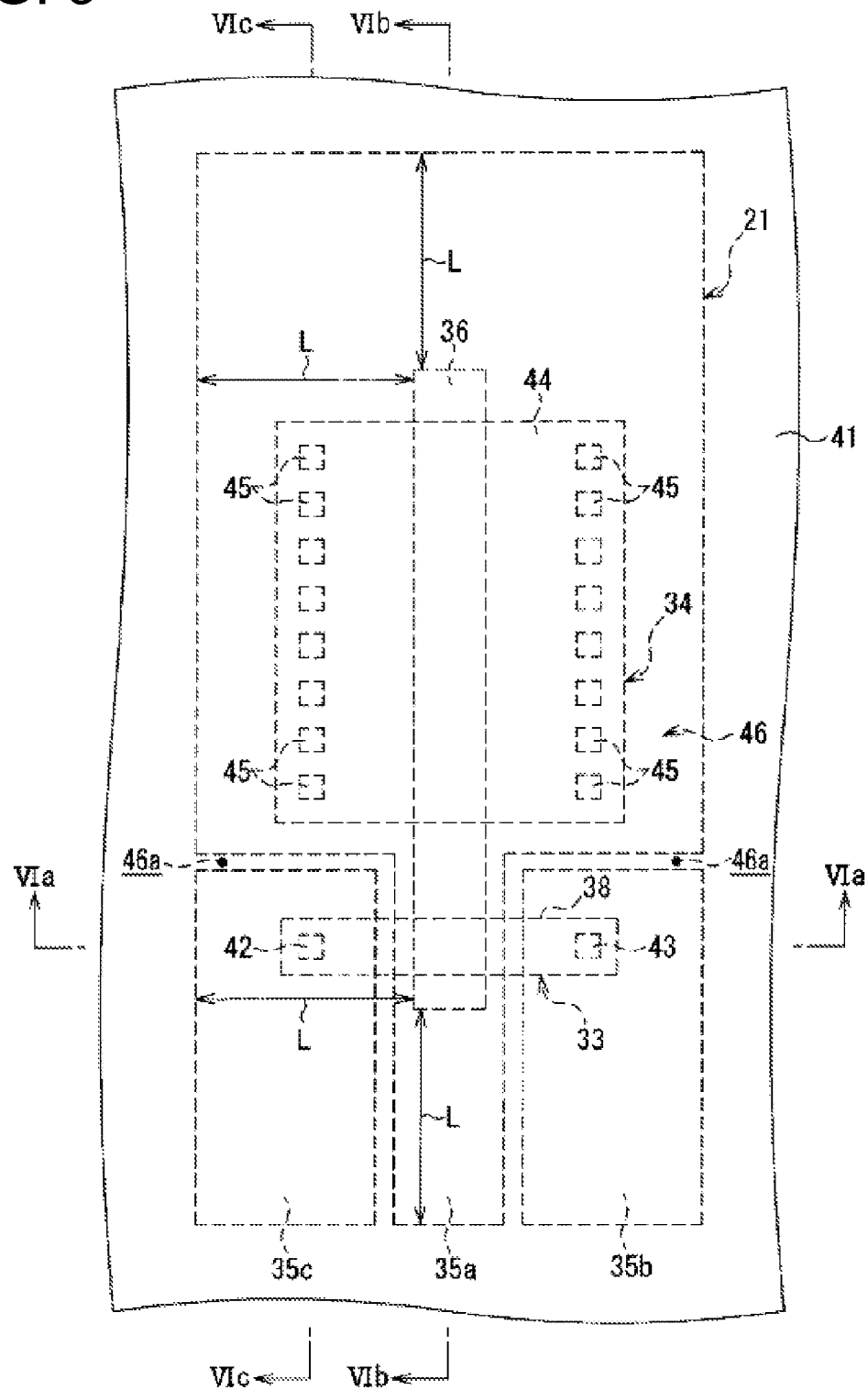
FIG. 5 is a plan-view layout drawing of the memory cell shown in FIG. 3.
Figure 6A:
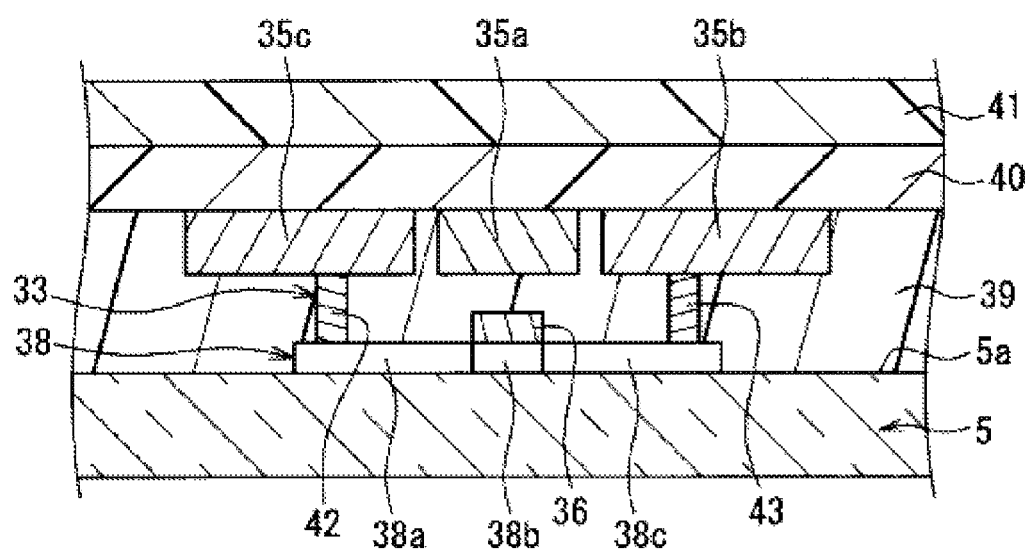
FIG. 6A is a cross-sectional drawing along the line VIa-VIa of FIG. 5.
Figure 6B:
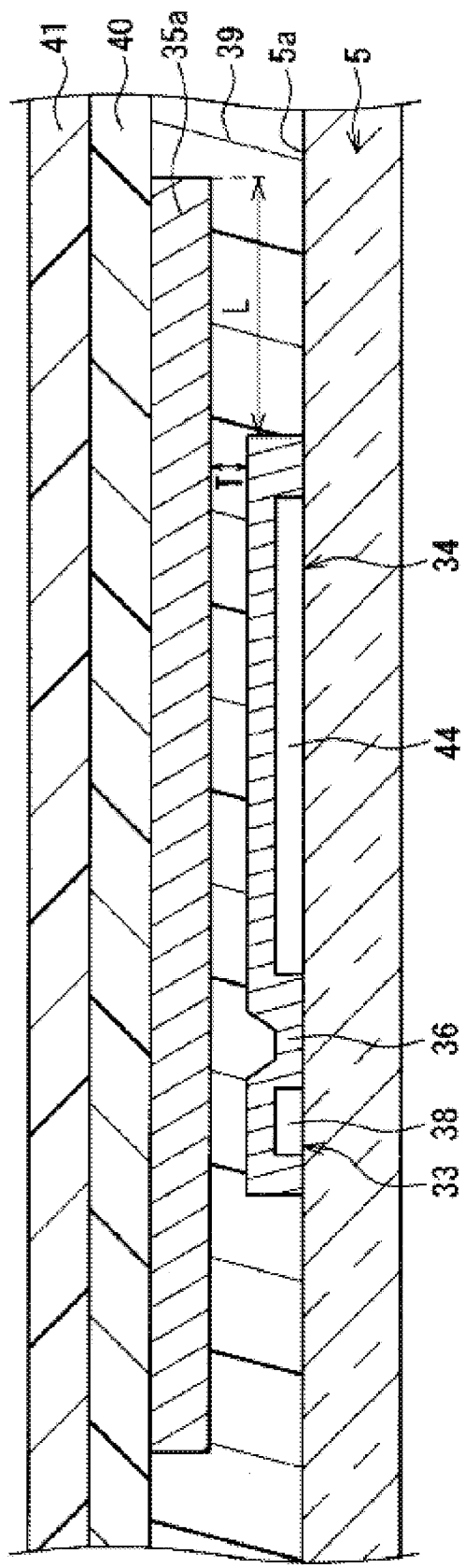
FIG. 6B is a cross-sectional drawing along the line VIb-VIb of FIG. 5.
Figure 6C:
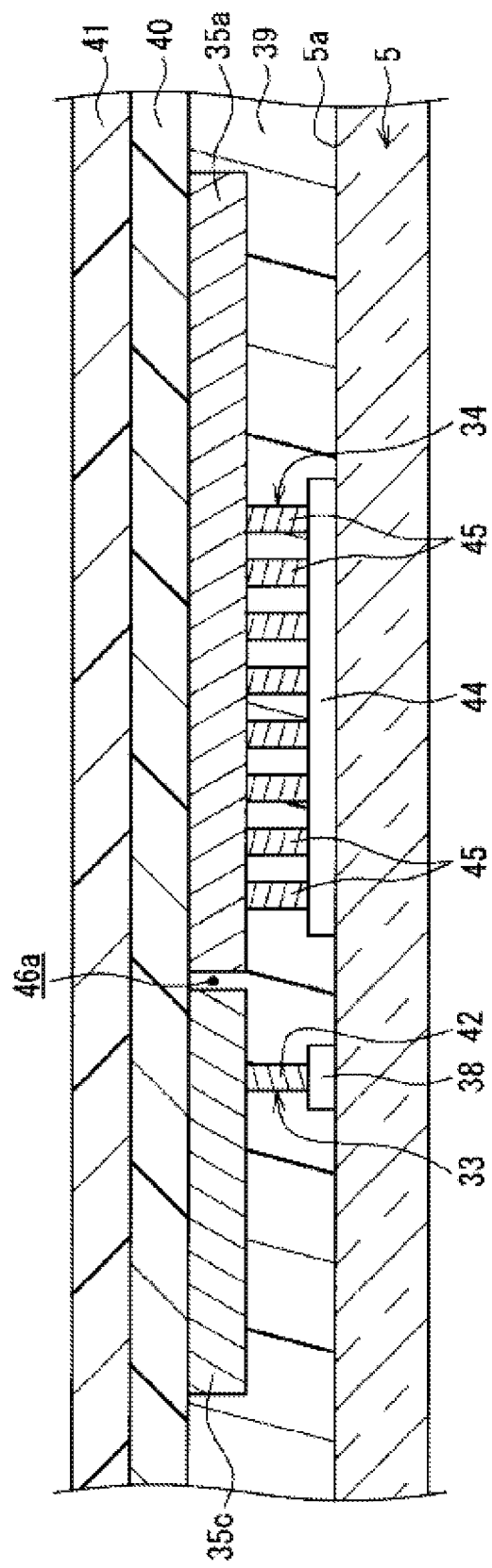
FIG. 6C is a cross-sectional drawing along the line VIc-VIc of FIG. 5.

FIG. 3 is a drawing that describes the configuration of the entire semiconductor device according to Embodiment 1 of the present invention. FIG. 4 is a circuit diagram that shows an equivalent circuit of the memory cell shown in FIG. 3. FIG. 5 is a plan-view layout drawing of the memory cell shown in FIG. 3. FIG. 6A is a cross-sectional drawing along the line VIa-VIa of FIG. 5. FIG. 6B is a cross-sectional drawing along the line VIb-VIb of FIG. 5. FIG. 6C is a cross-sectional drawing along the line VIc-VIc of FIG. 5.

As shown in FIG. 3, the semiconductor device of the present embodiment is provided with a memory cell array MA in which a plurality of memory cells 21 are arranged in a matrix form, and a driver part that drives the memory cell array MA per memory cell 21 unit. This driver part includes a data input/output terminal 22, an input buffer 23, a drain voltage control circuit 24, a column decoder 25, an address input terminal 26, an address buffer 27, a row decoder 28, a control gate voltage control circuit 29, a source voltage control circuit 30, an output buffer 32, and a sense amplifier 31, as shown in FIG. 3. In the semiconductor device of the present embodiment, the memory cell array MA and the driver part are arranged on the active matrix substrate 5 in the outer region of the active display region A (FIG. 2) of the liquid crystal panel 2.

In addition, the semiconductor device of the present embodiment is provided with a control unit (not shown in the drawings) for controlling each part of the driver part. The control unit selects a memory cell 21 that conducts a reading operation, a writing operation, or a deleting operation on data (information), based on an address signal inputted from the outside to the address input terminal 26, based on commands by a user. In addition, the semiconductor device of the present embodiment is configured such that the control unit controls the selected memory cell 21 to do a reading operation, a writing operation, or a deleting operation, based on commands by a user.

In the memory cell array MA, the plurality of memory cells 21 are arranged in a matrix form in a row direction and a column direction, as described above. Each memory cell 21 constitutes a non-volatile memory and can be overwritten electrically. Each memory cell 21 is also configured such that by radiating ultraviolet light from the outside, stored data can be erased.

The memory cell 21 of the present embodiment is provided with a memory cell transistor 33 and a MOS capacitor 34. In the memory cell 21 of the present embodiment, by electrically connecting the gate electrode of the memory cell transistor 33 to the gate electrode (one terminal) of the MOS capacitor 34, a floating gate electrode in a floating state, which will be described below, is provided. A non-volatile memory cell transistor (composite transistor) that uses a terminal of the MOS capacitor 34, which is not connected to the gate electrode of the memory cell transistor 33, as a control gate is configured in the memory cell 21 of the present embodiment.

In the memory cell 21 of the present embodiment, the control gate of the MOS capacitor 34 is connected to a word line WL, as shown in FIG. 3. The drain and the source of the memory cell 21 are each connected to a bit line BL and a source line SL. Also, in the present embodiment, the bit line BL and the source line SL each extend so as to be parallel to the column direction, and the word line WL extends so as to be parallel to the row direction, as shown in FIG. 3.

The drain voltage control circuit 24 is connected to a plurality of bit lines BL via the column decoder 25, and controls a voltage applied to each bit line BL.

The control gate voltage control circuit 29 is connected to a plurality of word lines WL via the row decoder 28, and controls a voltage applied to each word line WL.

The source voltage control circuit 30 is connected to a plurality of source lines SL, and controls a voltage applied to each source line SL.

The address buffer 27 divides the inputted address signals into column addresses and row addresses when address signals are inputted from the address input terminal 26. The address buffer 27 outputs the column address and the row address to the column decoder 25 and the row decoder 28, respectively. The column decoder 25 selects a bit line BL corresponding to the inputted column address, and the row decoder 28 selects the word line WL corresponding to the inputted row address. When the writing operation is conducted, the data inputted from the data input/output terminal 22 is written in to the memory cell 21 selected by the column decoder 25 and the row decoder 28, via the input buffer 23. Also, when the reading operation is conducted, the data written into the memory cell 21 selected by the column decoder 25 and the row decoder 28 is read, and after the data is amplified by the sense amplifier 31, the data is outputted to the data input/output terminal 22 via the output buffer 32.

As shown in FIG. 4, the memory cell (non-volatile memory) 21 includes the memory cell transistor 33 and the MOS capacitor 34. In the memory cell 21, the control gate, the drain, and the source thereof are respectively connected to conductive wiring line layers 35a, 35b, and 35c as wiring line layers. In the memory cell 21, the control gate, the drain, and the source are respectively connected to the word line WL, the bit line BL, and the source line SL via the conductive wiring line layers 35a, 35b, and 35c. As will be described below, the conductive wiring line layers 35a, 35b, and 35c are configured so as to also function as a shielding part.

In the memory cell 21, the gate electrode of the memory cell transistor 33 and the gate electrode of the MOS capacitor 34 are shared as the floating gate electrode 36, which is in a floating state. Additionally, in the memory cell 21, the floating gate electrode 36 constitutes a charge storage part that stores data corresponding to the amount of charge stored, and is used as a memory storage part that stores data.

As shown in FIGS. 5 and 6A to 6C, in the memory cell 21, each of the parts of the memory cell transistor 33 and the MOS capacitor 34 are formed on a main surface 5a of the active matrix substrate 5.

Specifically, as shown in FIGS. 5 and 6A, in the memory cell transistor 33, the semiconductor layer 38 thereof is formed on the main surface 5a of the active matrix substrate 5. Polysilicon is used, for example, for the semiconductor layer 38. A source region 38a of the semiconductor layer 38 is connected to the conductive wiring line layer 35c via a contact hole 42, and a drain region 38c of the semiconductor layer 38 is connected to the conductive wiring line layer 35b via a contact hole 43. The floating gate electrode 36 is formed on a channel region 38b of the semiconductor layer 38. The conductive wiring line layer 35a is provided so as to cover the floating gate electrode 36. The conductive wiring line layers 35a to 35c preferably include at least one of Ru, Ga, In, Ag, Al, Au, Cd, Co, Cr, Cu, Fe, Mg, Mo, Ni, Pb, Pd, Pt, Sn, Ta, Ti, V, W, Zn, Zr, and the like.

As shown in FIGS. 5, 6B, and 6C, in the MOS capacitor 34, a semiconductor layer 44 thereof is formed on the main surface 5a of the active matrix substrate 5. Polysilicon is used, for example, for the semiconductor layer 44. The conductive wiring line layer 35a is provided so as to cover the semiconductor layer 44, and the conductive wiring line layer 35a and the semiconductor layer 44 are electrically connected to each other via contact holes 45 so as to be at the same potential.

In the memory cell 21 of the present embodiment, an insulating film 39 is provided so as to cover the floating gate electrode 36, the semiconductor layer 38, and the semiconductor layer 44. The insulating film 39 is made of an oxidized insulating film such as silicon oxide formed through the plasma CVD method, for example. Also, the insulating film 39 is made of a film that is formed at a high temperature greater than a prescribed temperature when being formed. As a result, the insulating film 39 is configured such that impurities including water and mobile ions such as hydrogen ions are greatly reduced and a negative effect thereof to the storability of data of the floating gate electrode (memory storage part) 36 is reduced as much as possible.

Other than what is described above, silicon nitride formed through the plasma CVD method, for example, can be used for the insulating film 39. In addition, tantalum oxide or aluminum oxide formed through anode oxidation of the gate wiring lines G or the gate electrodes of the thin film transistors 18, for example, can be used for the insulating film 39.

In addition, in the memory cell 21 of the present embodiment, a passivation insulating film 40 and an organic polymer film 41 are formed in this order on the conductive wiring line layers 35a to 35c and the insulating film 39. The passivation insulating film 40 and the organic polymer film 41 constitute an insulating layer provided above the memory cell (non-volatile memory) 21. The passivation insulating film 40 is made of an inorganic insulating film such as silicon oxide, for example. The organic polymer film 41 is made of an organic polymer such as acrylic, for example. In addition, a transparent electrode layer that constitutes the pixel electrode 19 is disposed (not shown in drawings) above the organic polymer film 41. On the active matrix substrate 5, the insulating film 39, the passivation insulating film 40, and the organic polymer film 41 are appropriately formed above the thin film transistors 18 of the liquid crystal panel 2 provided inside the active display region A.

In the memory cell 21 of the present embodiment, a shielding part 46, which is provided between the floating gate electrode (memory storage part) 36, and the passivation insulating film 40 and the organic polymer film 41 (insulating layer), and shields the floating gate electrode 36 so as to prevent impurities from the passivation insulating film 40 and the organic polymer film 41 from reaching the floating gate electrode 36, is constituted of the conductive wiring line layers 35a to 35c. The shielding part 46 is delimited by a rectangular region that surrounds the entirety of the conductive wiring line layers 35a to 35c in FIG. 5.

The shielding part 46 is configured to fulfill the following inequality (1):

$$L/T \geq 5 \qquad (1),$$

where L (FIGS. 5 and 6B) is a protruding dimension of the shielding part 46 with respect to the floating gate electrode (memory storage part) 36, and T (FIG. 6B) is a distance between the floating gate electrode 36 and the shielding part 46 in a perpendicular direction to the main surface 5a of the active matrix substrate 5.

In addition, the shielding part 46 is provided with openings 46a that are 5% to 20% of the shielding area. In other words, in the shielding part 46, slit shaped openings 46a are provided between the conductive wiring line layer 35a in a protruding shape and each of the conductive wiring line layers 35b and 35c in a rectangular shape, as shown in FIG. 5. The opening area of the two openings 46a is set to be 5% to 20% of the shielding area of the shielding part 46.

In the memory cell (semiconductor device) 21 according to the present embodiment configured as described above, the conductive wiring line layers 35a to 35c (shielding parts) that shield the floating gate electrode 36 are provided between the floating gate electrode 36, and the passivation insulating film 40 and the organic polymer film 41 so as to prevent impurities from the passivation insulating film 40 and the organic polymer film 41 (insulating layer) from reaching the floating gate electrode (memory storage part) 36. As a result, in the memory cell 21 of the present embodiment, impurities including water and mobile ions such as hydrogen ions, which are present inside the passivation insulating film 40 and the organic polymer film 41, are prevented from reaching the floating gate electrode 36. As a result, in the present embodiment, a memory cell 21 that can maintain the storability of data in the floating gate electrode 36, unlike the conventional examples, can be configured.

Figure 7:
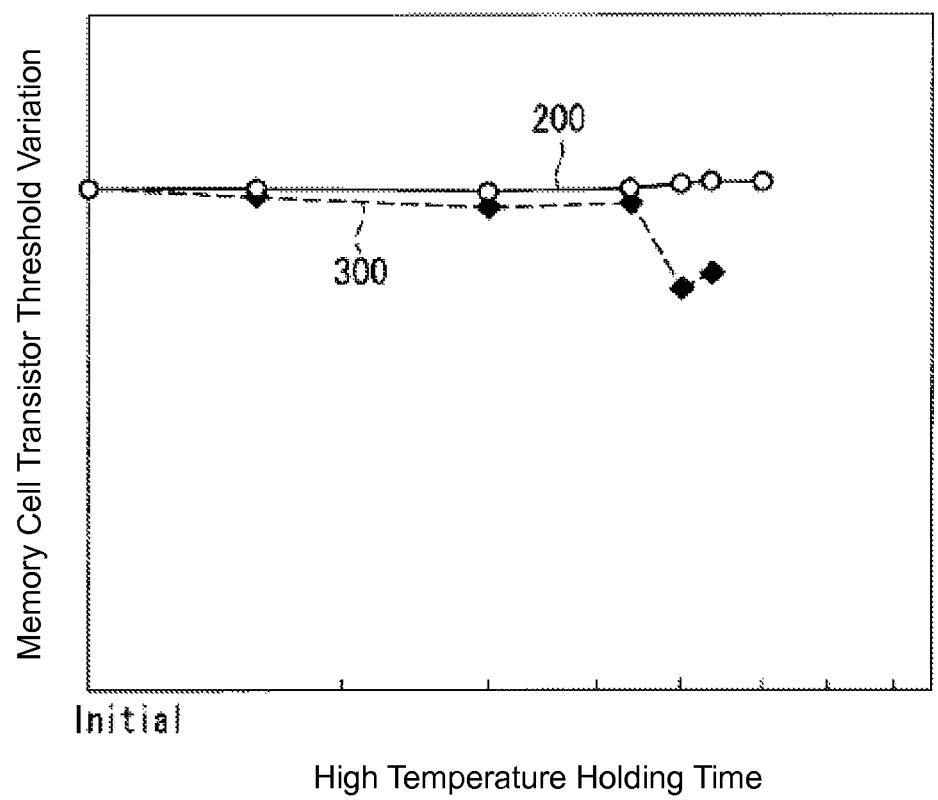
FIG. 7 is a graph that shows results of a verification test of the memory cell shown in FIG. 3.

Here, results of a verification test done by the inventors of the present invention are described in detail, with reference to FIG. 7.

FIG. 7 is a graph that shows results of a verification test of the memory cell shown in FIG. 3.

In the verification test, a working example of the present embodiment and a conventional product that is not provided with a shielding part were prepared, and after writing in data, the thresholds (voltage) of the memory cell transistors of the working example of the present embodiment and the conventional product were raised. In that state, both were left in a high temperature setting for a long period of time, and the variation in the thresholds during that time was evaluated by the experiment.

As shown in a curve 200 in FIG. 7, it was confirmed that in the working example of the present embodiment, the threshold of the memory cell transistor was kept stable.

In contrast, as shown in a curve 300 in FIG. 7, in the conventional product, a decrease in the threshold voltage and a drift phenomenon were observed. This decrease in threshold voltage represents the loss of the electrons that are charges for storage, and the drift phenomenon represents the instability of memory data as a result of mobile ions and the like.

As stated above, it was verified that the memory cell 21 of the present invention differs from the conventional example in that the storability of data in the floating gate electrode 36 can be maintained.

In the present embodiment, the shielding part 46 is configured so as to fulfill the inequality (1); therefore, the impurities described above can be effectively prevented from reaching the floating electrode 36.

In the present embodiment, the shielding part 46 is provided with openings 46a that are 5% to 20% of the shielding area. As a result, in the present embodiment, a decrease in shielding effect by the shielding part 46 can be prevented while easily being able to erase stored data using ultraviolet light. Also, by providing slit shaped openings 46a, the conductive wiring line layers 35a to 35c can also be used as the shielding part 46, the shielding part 46 can be maintained in as wide an area as possible, and a decrease in flexibility of the design due to the shielding part 46 can be suppressed.

If the opening 46a is set to be less than 5% of the shielding area, deletion of stored data using ultraviolet light becomes difficult.

If the opening 46a is set to exceed 20% of the shielding area, then the shielding effect is decreased.

In the present embodiment, the conductive wiring line layer 35a and the semiconductor layer 44 of the MOS capacitor 34 are electrically connected to each other via contact holes 45 so as to be at the same potential. As a result, in the present embodiment, the capacitance of the memory cell 21 can be increased, the potential of the control gate can be made low, and the voltage of the memory cell 21 can be decreased.

Specifically, if the capacitance of the semiconductor layer 44 of the MOS capacitor 34 and the floating gate electrode 36 is Ccg, the total parasitic capacitance to the floating gate electrode 36 is Ctot, and the potential of the control gate is Vcg, then the potential Vfg of the floating gate electrode 36 is as shown below in formula (1).

$$Vfg = Ccg/Ctot \times Vcg + \alpha \qquad (1)$$

However, α is the effect of the stored charge in the floating gate electrode 36 or the voltage from other nodes coupled by parasitic capacitance to the floating gate electrode 36.

It is apparent from the formula (1) that the greater the capacitance Ccg is, the closer the potential Vfg of the floating gate electrode 36 can be made to the potential Vcg of the control gate, and the potential Vcg of the control gate can be made low. Therefore, it is preferable for Ccg/Ctot to be as large as possible; in other words, for the capacitance Ccg to be as large as possible. In the present embodiment, by electrically connecting the conductive wiring line layer 35a to the semiconductor layer 44 of the MOS capacitor 34, the control gate connected to the conductive wiring line layer 35a is coupled to the floating gate electrode 36 by capacitance. As a result, the capacitance between the conductive wiring line layer 35a and the floating gate electrode 36 can be added to the normal capacitance Ccg between the semiconductor layer 44 and the floating gate electrode 36, and the capacitance Ccg can be made greater, thus reducing the voltage of the memory cell 21.

In the present embodiment, a semiconductor device that can maintain the storability of data is used, so high performance active matrix substrate 5 and liquid crystal display device (display device) 1 that can store data can be easily configured.

Aside from what was described above, the conductive wiring line layers (shielding parts) 35a to 35c may be made of a transparent electrode such as ITO (indium tin oxide) (the same applies to other embodiments described below).

Embodiment 2

Figure 8:
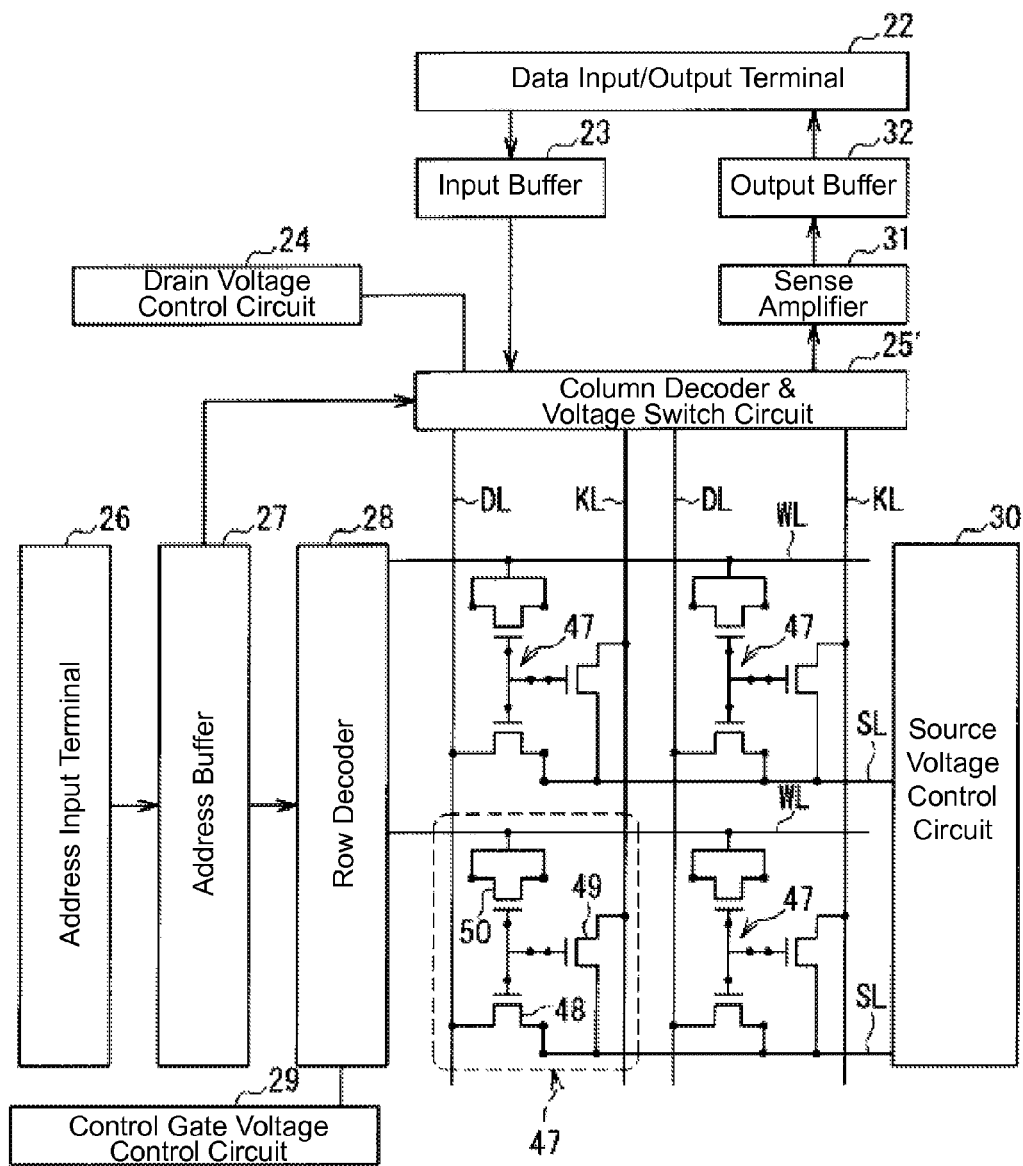
FIG. 8 is a drawing that describes a configuration of an entire semiconductor device according to Embodiment 2 of the present invention.
Figure 9:
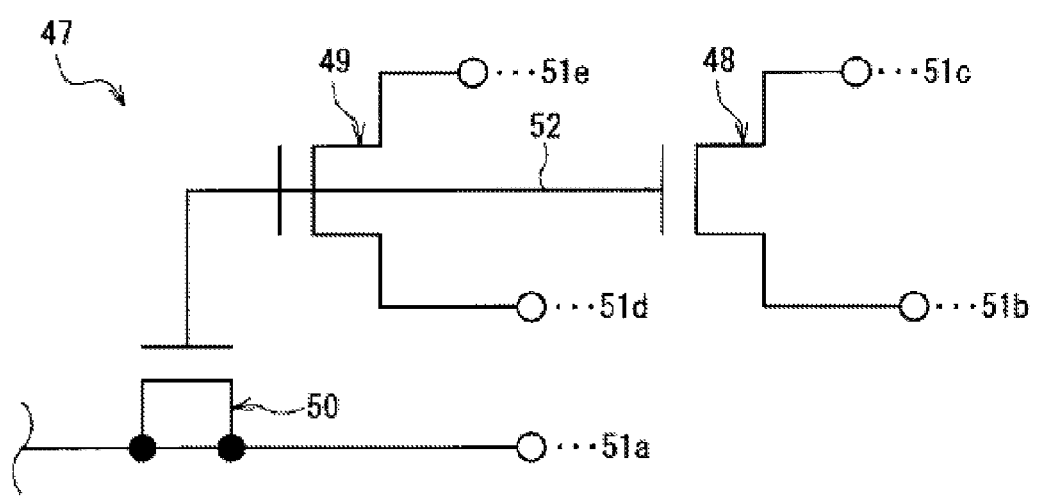
FIG. 9 is a circuit diagram that shows an equivalent circuit of a memory cell shown in FIG. 8.
Figure 10:
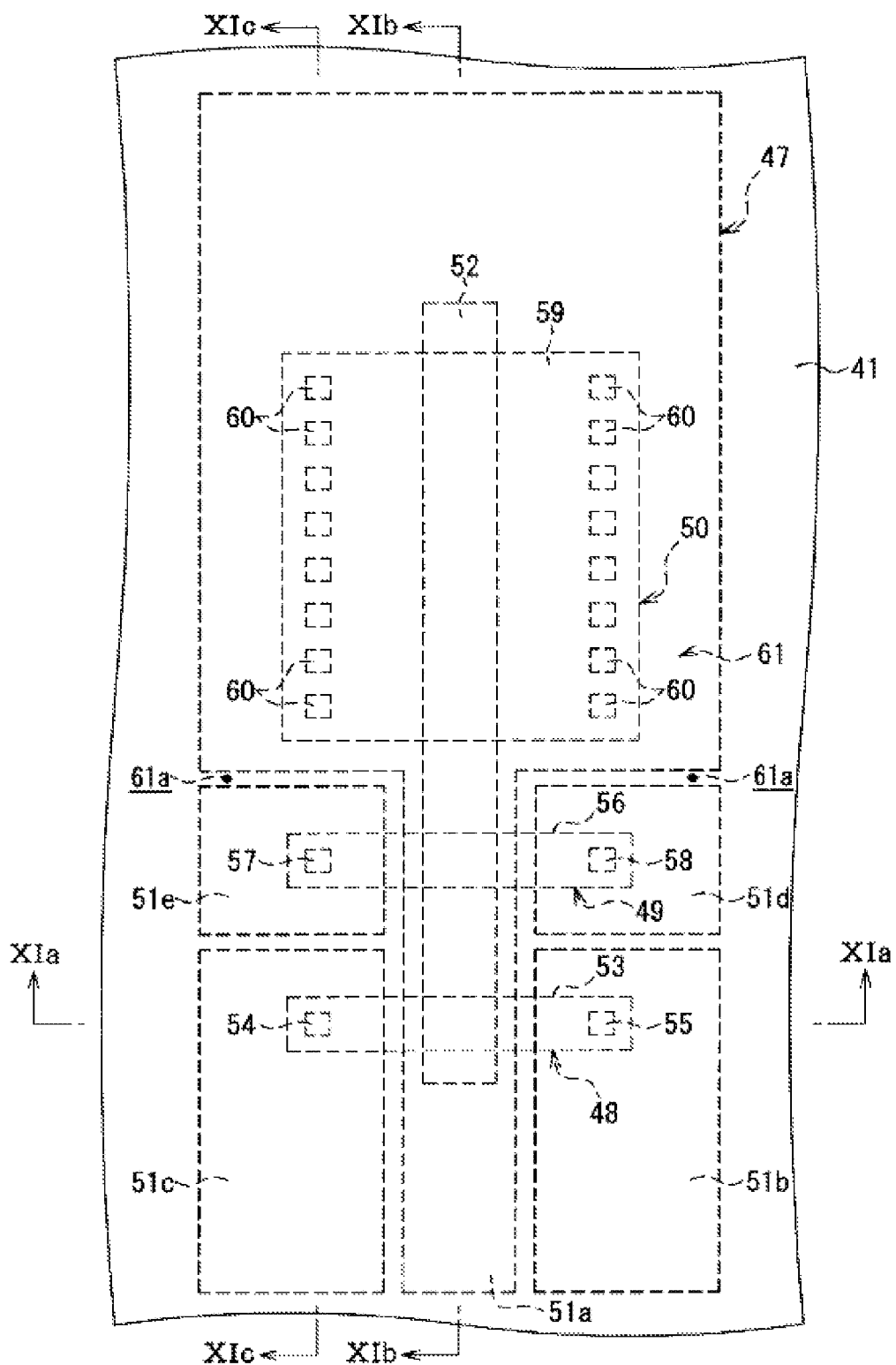
FIG. 10 is a plan-view layout drawing of a memory cell shown in FIG. 8.
Figure 11A:
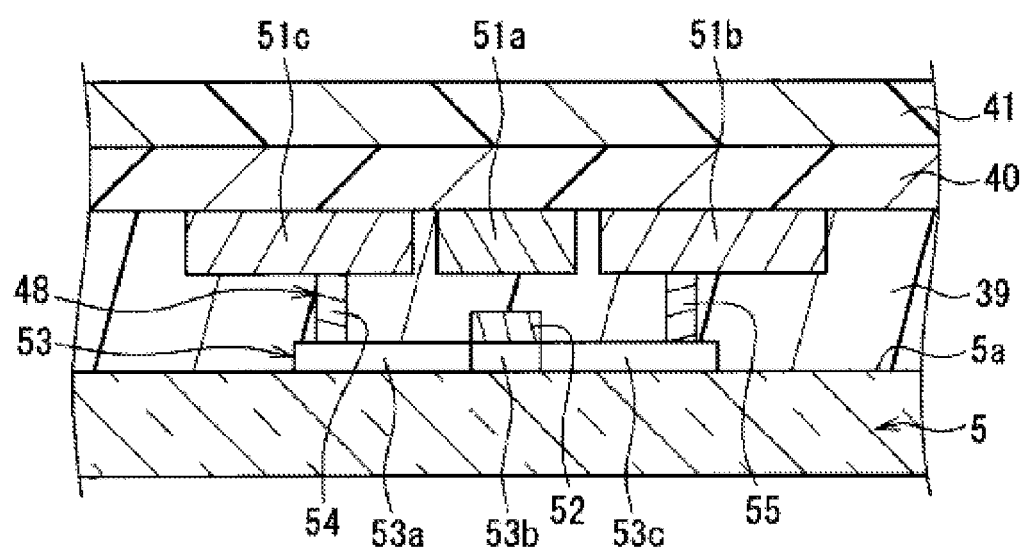
FIG. 11A is a cross-sectional drawing along the line XIa-XIa of FIG. 10.
Figure 11B:
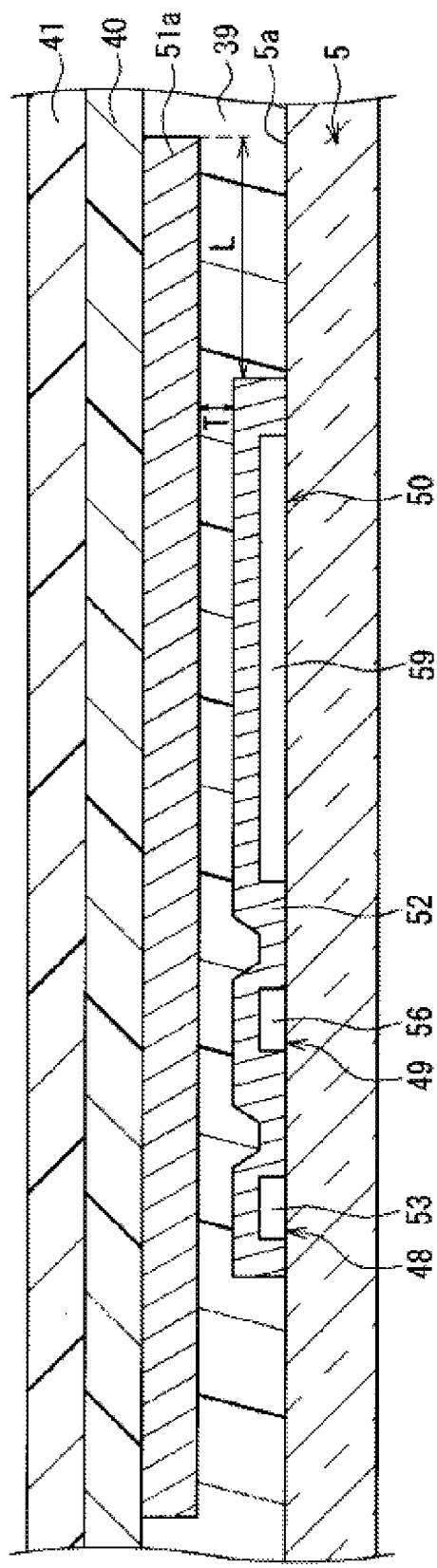
FIG. 11B is a cross-sectional drawing along the line XIb-XIb of FIG. 10.
Figure 11C:
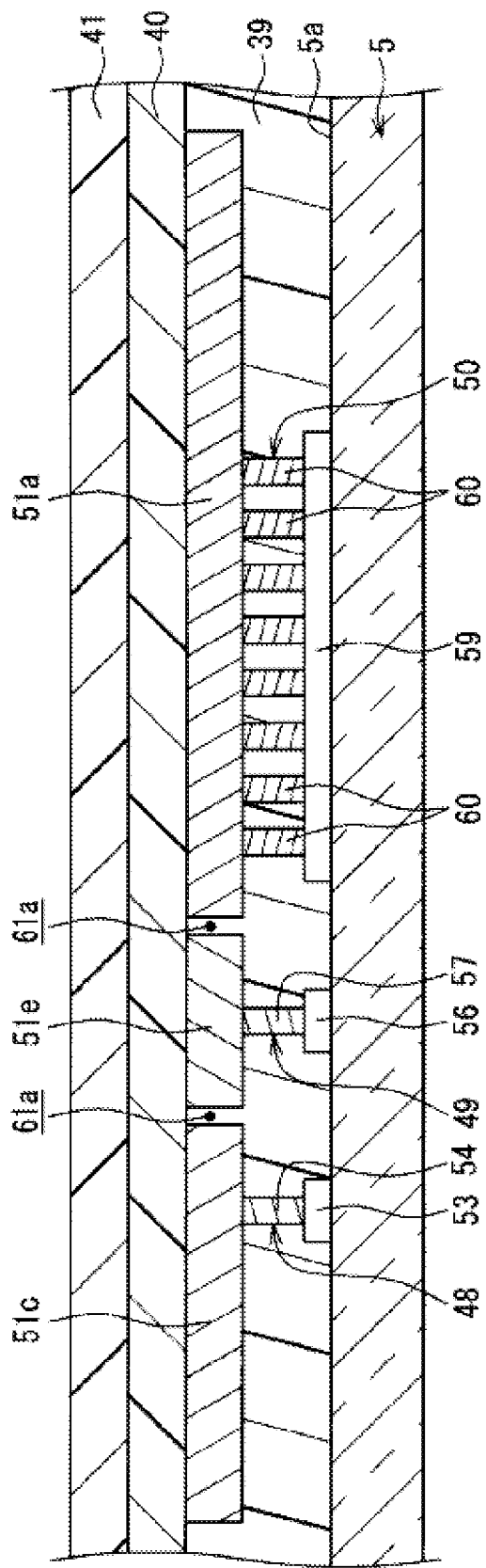
FIG. 11C is a cross-sectional drawing along the line XIc-XIc of FIG. 10.

FIG. 8 is a drawing that describes a configuration of an entire semiconductor device according to Embodiment 2 of the present invention. FIG. 9 is a circuit diagram that shows an equivalent circuit of a memory cell shown in FIG. 8. FIG. 10 is a plan view layout drawing of the memory cell shown in FIG. 8. FIG. 11A is a cross-sectional drawing along the line XIa-XIa of FIG. 10. FIG. 11B is a cross-sectional drawing along the line XIb-XIb of FIG. 10. FIG. 11C is a cross-sectional drawing along the line XIc-XIc of FIG. 10. In the drawings, the main difference between the present embodiment and Embodiment 1 is that the reading memory cell transistor and the writing memory cell transistor are provided independent of each other. Elements that are in common with Embodiment 1 are given the same reference characters, and descriptions thereof are omitted.

In other words, as shown in FIG. 8, a semiconductor device of the present embodiment has a plurality of memory cells 47 disposed in a matrix form. Each memory cell 47 is provided with a reading memory cell transistor 48, a writing memory cell transistor 49, and a MOS capacitor 50.

In the memory cell 47 of the present embodiment, the control gate of the MOS capacitor 50 is connected to a word line WL, as shown in FIG. 8. The drain and the source of the reading memory cell transistor 48 are connected to the data line DL and the source line SL, respectively. The drain and the source of the writing memory cell transistor 49 are connected to the writing line KL and the source line SL, respectively. As shown in FIG. 8, in the present embodiment, the word line WL and the source line SL each extend so as to be parallel to the row direction, and the data line DL and the writing line KL extend so as to be parallel to the column direction. The data line DL and the writing line KL are connected to a column decoder and voltage switch circuit 25'. The column decoder and voltage switch circuit 25' is made to apply a prescribed voltage to the writing line KL when a writing operation is done to the memory cell 47. The column decoder and voltage switch circuit 25' is made to apply a prescribed voltage to the data line DL when a reading operation is done to the memory cell 47.

As shown in FIG. 9, the memory cell (non-volatile memory) 47 includes the reading memory cell transistor 48, the writing memory cell transistor 49, and the MOS capacitor 50. In the memory cell 47, a conductive wiring line layer 51a is connected to the control gate as a wiring line layer. Also, in the memory cell 47, the drain and the source of the reading memory cell transistor 48 are connected to conductive wiring line layers 51b and 51c, respectively, as wiring line layers. In addition, the drain and the source of the writing memory cell transistor 49 are connected to conductive wiring line layers 51d and 51e, respectively, as wiring line layers.

In the memory cell 47, the control gate, the drain and source of the reading memory cell transistor 48, and the drain and source of the writing memory cell transistor 49 are respectively connected to the word line WL, the data line DL, the source line SL, the writing line KL, and the source line SL via conductive wiring line layers 51a, 51b, 51c, 51d, and 51e. These conductive wiring line layers 51a, 51b, 51c, 51d, and 51e are configured so as to function as shielding parts, as will be described below.

In the memory cell 47, the gate electrode of the reading memory cell transistor 48, the gate electrode of the writing memory cell transistor 49, and the gate electrode of the MOS capacitor 50 are shared as a floating gate electrode 52, which is in a floating state. In addition, in the memory cell 47, the floating gate electrode 52 constitutes a charge storage part that stores data corresponding to the amount of charge stored, and the floating gate electrode 52 is used as a memory storage part for storing data.

As shown in FIGS. 10 and 11A to 11C, in the memory cell 47, each of the parts of the reading memory cell transistor 48, the writing memory cell transistor 49, and the MOS capacitor 50 are formed on the main surface 5a of the active matrix substrate 5.

Specifically, as shown in FIGS. 10 and 11A, in the reading memory cell transistor 48, the semiconductor layer 53 thereof is formed on the main surface 5a of the active matrix substrate 5. Polysilicon is used, for example, for the semiconductor layer 53. The source region 53a of the semiconductor layer 53 is connected to the conductive wiring line layer 51c via a contact hole 54, and the drain region 53c of the semiconductor layer 53 is connected to the conductive wiring line layer 51b via a contact hole 55. The floating gate electrode 52 is formed on a channel region 53b on the semiconductor layer 53. The conductive wiring line layer 51a is provided so as to cover the floating gate electrode 52.

As shown in FIGS. 11B and 11C, in the writing memory cell transistor 49, the semiconductor layer 56 thereof is formed on the main surface 5a of the active matrix substrate 5. Polysilicon, for example, is used for the semiconductor layer 56. As shown in FIG. 10, the source region of the semiconductor layer 56 is connected to the conductive wiring line layer 51e via a contact hole 57, and the drain region of the semiconductor layer 56 is connected to the conductive wiring line layer 51d via a contact hole 58. The floating gate electrode 52 is formed in the channel region of the semiconductor layer 56. The conductive wiring line layer 51a is provided so as to cover the floating gate electrode 52.

As shown in FIGS. 10, 11B, and 11C, in the MOS capacitor 50, a semiconductor layer 59 thereof is formed on the main surface 5a of the active matrix substrate 5. Polysilicon, for example, is used for the semiconductor layer 59. The conductive wiring line layer 51a is provided so as to cover the semiconductor layer 59, and the conductive wiring line layer 51a and the semiconductor layer 59 are electrically connected to each other via contact holes 60 so as to be at the same potential.

In the memory cell 47 of the present embodiment, a shielding part 61 that shields the floating gate electrode 52 is constituted of the conductive wiring line layers 51a to 51e so as to be provided between the floating gate electrode (memory storage part) 52, and the passivation insulating film 40 and the organic polymer film 41 (insulating film), and so as to prevent impurities from the passivation insulating film 40 and the organic polymer film 41 from reaching the floating gate electrode 52. The shielding part 61 is delimited by a rectangular region that surrounds all of the conductive wiring line layers 51a to 51e in FIG. 10.

The shielding part 61 is configured so as to fulfill the following inequality (1):

$$L/T \geq 5 \quad (1),$$

where L (FIG. 11B) is a protruding dimension of the shielding part 61 with respect to the floating gate electrode (memory storage part) 52, and T (FIG. 11B) is a distance between the floating gate electrode 52 and the shielding part 61 in a perpendicular direction to the main surface 5a of the active matrix substrate 5.

In addition, the shielding part 61 is provided with openings 61a that are 5% to 20% of the shielding area. In other words, in the shielding part 61, slit shaped openings 61a are provided: between the conductive wiring line layer 51a in a protruding shape and the conductive wiring line layers 51b to 51e in a rectangular shape; between the conductive wiring line layer 51b and the conductive wiring line layer 51d; and between the conductive wiring line layer 51c and the conductive wiring line layer 51e, as shown in FIG. 10. The opening area of the openings 61a is set to be 5% to 20% of the shielding area of the shielding part 61.

With this configuration, functions and effects similar to Embodiment 1 can be attained with the present embodiment. In the present embodiment, the reading memory cell transistor 48 and the writing memory cell transistor 49 are provided independent of each other so a memory cell (non-volatile memory) 47 having excellent reliability can be configured.

Embodiment 3

Figure 12:
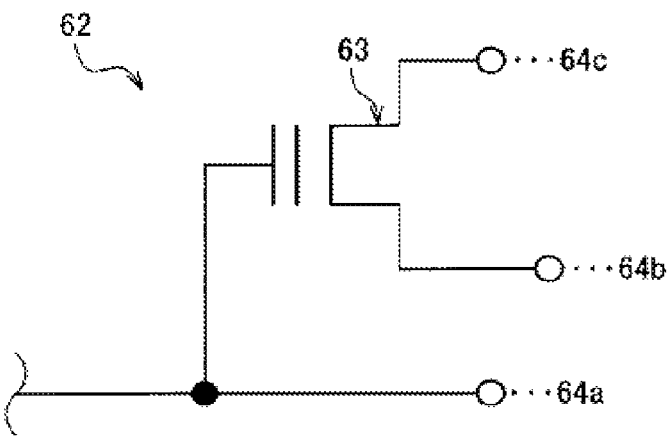
FIG. 12 is a circuit diagram that shows an equivalent circuit of a memory cell according to Embodiment 3 of the present invention.
Figure 13:
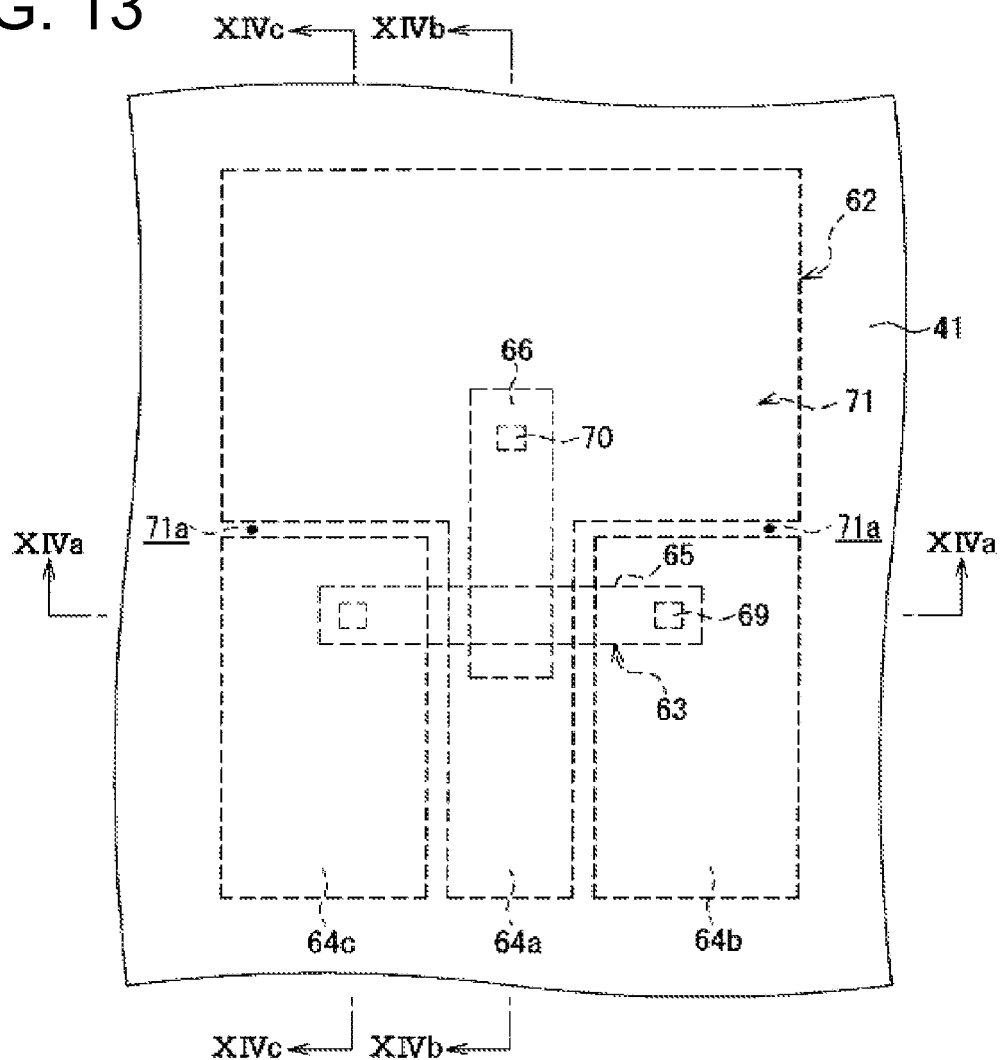
FIG. 13 is a plan-view layout drawing of the memory cell shown in FIG. 12.
Figure 14A:
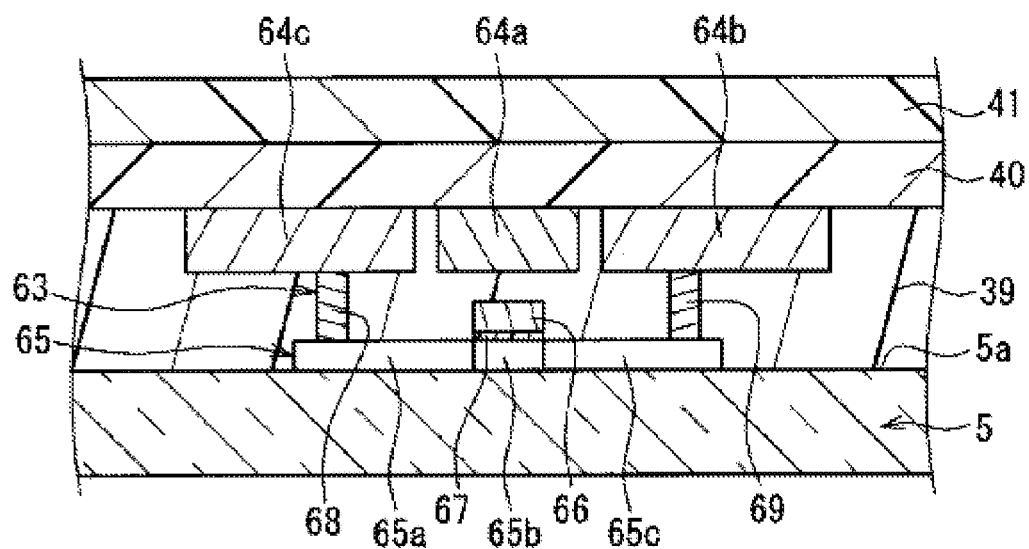
FIG. 14A is a cross-sectional drawing along the line XIVa-XIVa of FIG. 13.
Figure 14B:
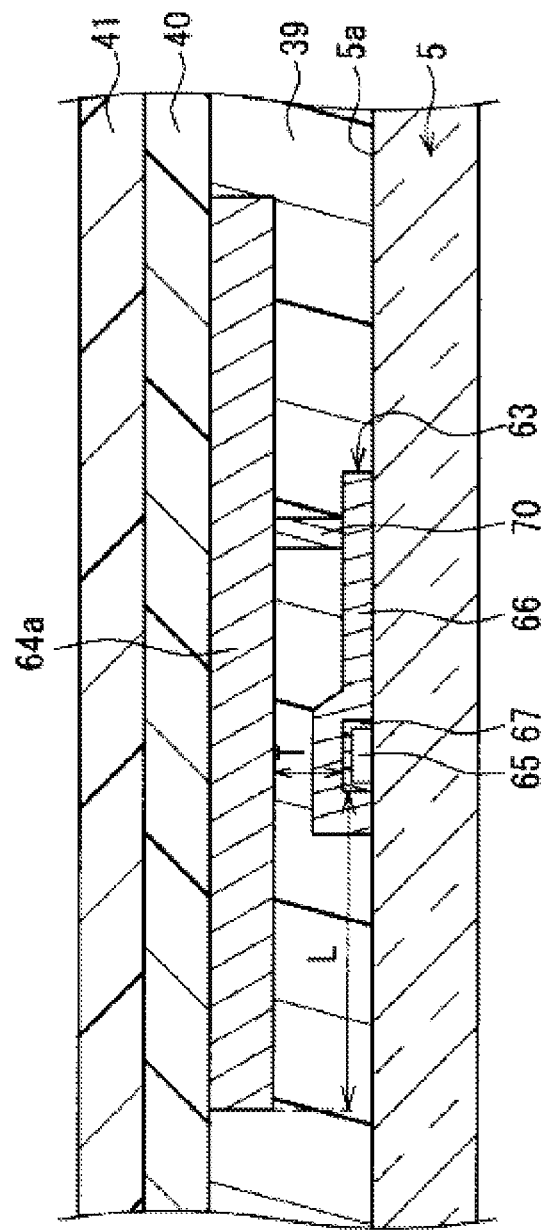
FIG. 14B is a cross-sectional drawing along the line XIVb-XIVb of FIG. 13.
Figure 14C:
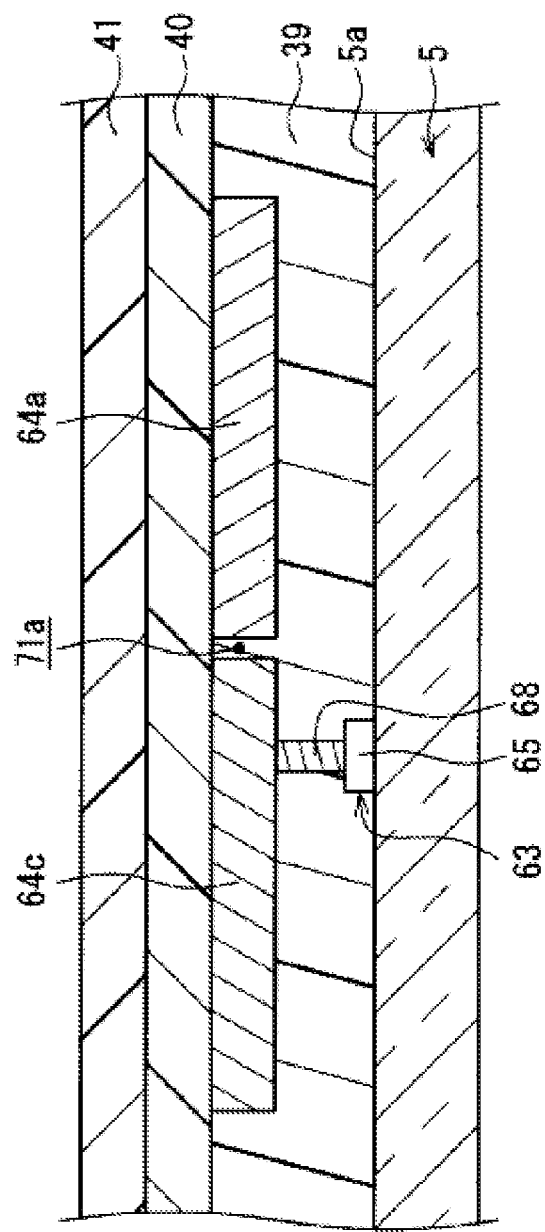
FIG. 14C is a cross-sectional drawing along the line XIVc-XIVc of FIG. 13.

FIG. 12 is a circuit diagram that shows an equivalent circuit of a memory cell according to Embodiment 3 of the present invention. FIG. 13 is a plan view layout drawing of the memory cell shown in FIG. 12. FIG. 14A is a cross-sectional drawing along the line XIVa-XIVa of FIG. 13. FIG. 14B is a cross-sectional drawing along the line XIVb-XIVb of FIG. 13. FIG. 14C is a cross-sectional drawing along the line XIVc-XIVc of FIG. 13. In the drawings, the main difference between the present embodiment and Embodiment 1 is that a trap insulating film provided between the semiconductor layer and the gate electrode of the memory cell transistor is used as a charge storage part (memory storage part) instead of a floating gate electrode. Elements that are in common with Embodiment 1 are given the same reference characters, and descriptions thereof are omitted.

In other words, as shown in FIG. 12, a memory cell (non-volatile memory) 62 of the present embodiment includes a memory cell transistor 63. In the memory cell 62, the control gate, the drain, and the source are respectively connected to conductive wiring line layers 64a, 64b, and 64c as wiring line layers. Also, in the memory cell 62, the control gate, the drain, and the source are respectively connected to a word line WL, a bit line BL, and a source line SL via the conductive wiring line layers 64a, 64b, and 64c. The conductive wiring line layers 64a, 64b, and 64c are configured so as to also function as shielding parts, as will be described below.

As shown in FIGS. 13 and 14A to 14C, in the memory cell 62, each of the parts of the memory cell transistor 63 are formed on a main surface 5a of an active matrix substrate 5. In the memory cell 62, a trap insulating film 67 is provided between a semiconductor layer 65 and a gate electrode 66 of the memory cell transistor 63. In the memory cell 62, the trap insulating film 67 constitutes the charge storage part that stores data corresponding to the amount of charge stored, and the trap insulating film 67 is used as a memory storage part that stores data.

Specifically, as shown in FIGS. 13 and 14A to 14C, in the memory cell transistor 63, the semiconductor layer 65 thereof is formed on the main surface 5a of the active matrix substrate 5. Polysilicon is used, for example, is used for the semiconductor layer 65. A source region 65a of the semiconductor layer 65 is connected to the conductive wiring line layer 64c via a contact hole 68, and a drain region 65c of the semiconductor layer 65 is connected to a the conductive wiring line layer 64b via a contact hole 69. The trap insulating film 67 and the gate electrode 66 are formed on a channel region 65b of the semiconductor layer 65 in that order. The conductive wiring line layer 64a is provided so as to cover the trap insulating film 67.

In the memory cell 62 of the present embodiment, a shielding part 71 that shields the trap insulating film 67 is constituted of the conductive wiring line layers 64a to 64c so as to be provided between the trap insulating film (memory storage part) 67, and the passivation insulating film 40 and the organic polymer film 41 (insulating layer), and so as to prevent impurities from the passivation insulating film 40 and the organic polymer film 41 from reaching the trap insulating film 67. The shielding part 71 is delimited by a rectangular region that surrounds the entirety of the conductive wiring line layers 64a to 64c in FIG. 13.

The shielding part 71 is configured so as to fulfill the following inequality (1):

$$L/T \geq 5 \qquad (1),$$

where L (FIG. 14B) is a protruding dimension of the shielding part 71 with respect to the trap insulating film (memory storage part) 67, and T (FIG. 14B) is a distance between the trap insulating film 67 and the shielding part 71 in a perpendicular direction to the main surface 5a of the active matrix substrate 5.

In addition, the shielding part 71 is provided with openings 71a that are 5% to 20% of the shielding area. In other words, in the shielding part 71, slit shaped openings 71a are provided between the conductive wiring line layer 64a in a protruding shape and each of the conductive wiring line layers 64b and 64c in a rectangular shape, as shown in FIG. 13. The area of the two openings 71a is set to be 5% to 20% of the shielding area of the shielding part 71.

With this configuration, functions and effects similar to Embodiment 1 can be attained with the present embodiment. In the present embodiment, a trap insulating film (memory storage part) 67 is shielded by the conductive wiring line layers (shielding parts) 64a to 64c, so the storability of data in the trap insulating film 67 can be maintained. By using the trap insulating film 67, an easy-to-manufacture memory cell (semiconductor device) 62 can be configured.

Embodiment 4

Figure 15:
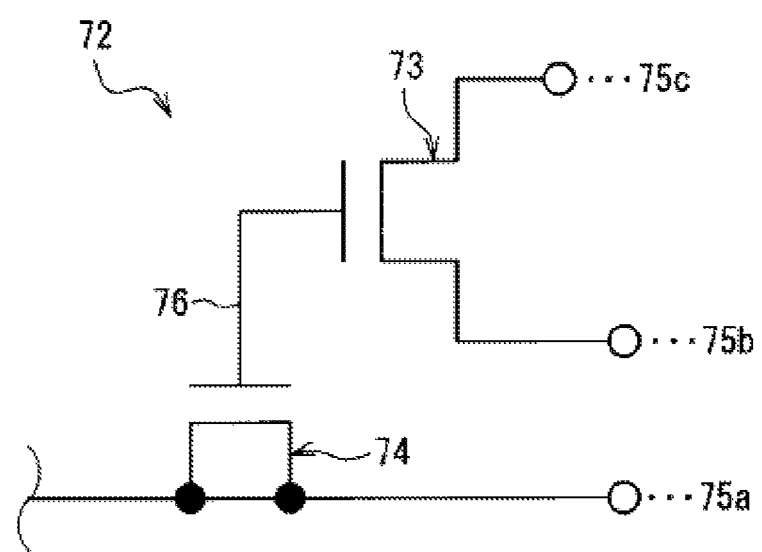
FIG. 15 is a circuit diagram that shows an equivalent circuit of a memory cell according to Embodiment 4 of the present invention.
Figure 16:
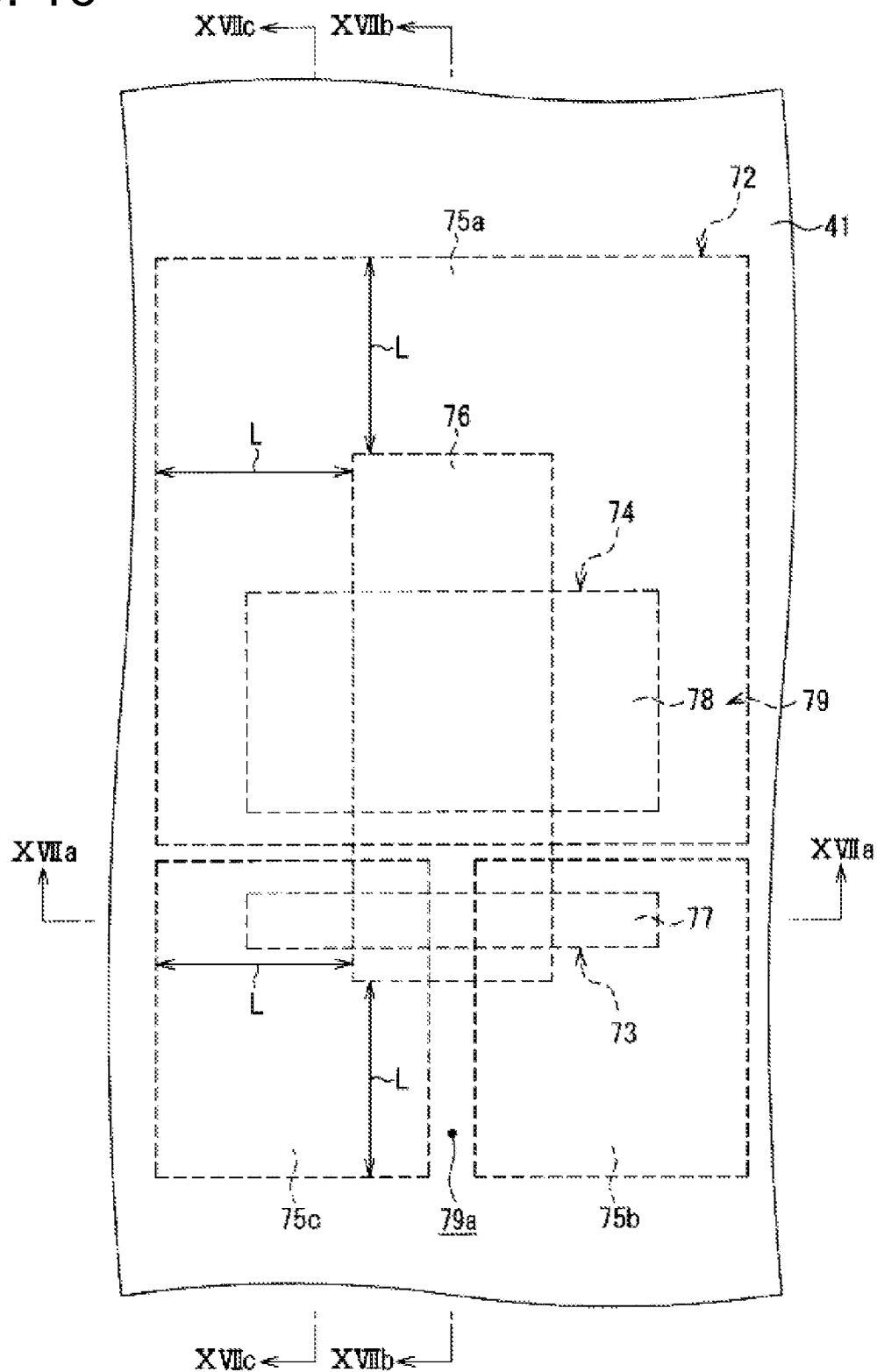
FIG. 16 is a plan view layout drawing of the memory cell shown in FIG. 15.
Figure 17A:
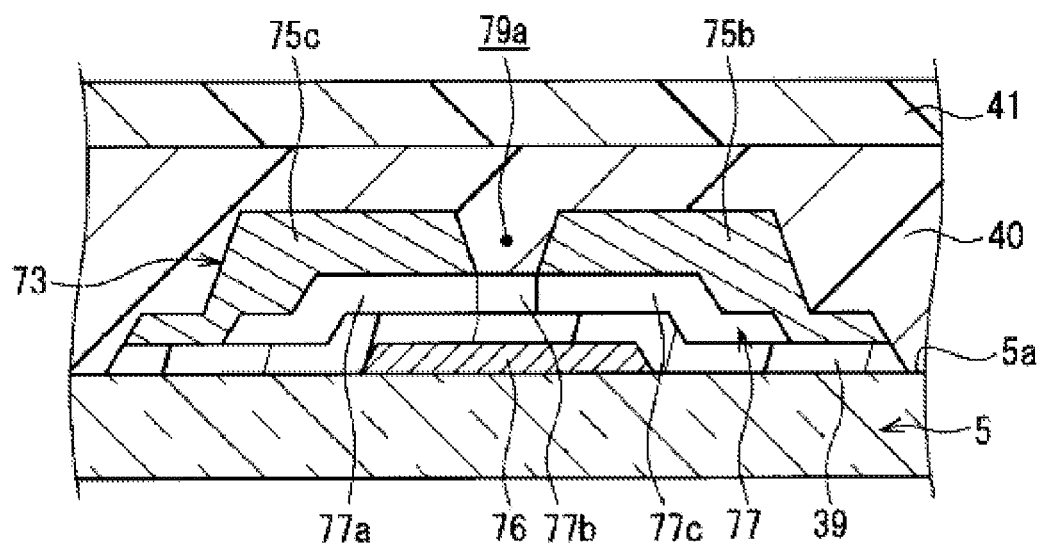
FIG. 17A is a cross-sectional drawing along the line XVIIa-XVIIa of FIG. 16.
Figure 17B:
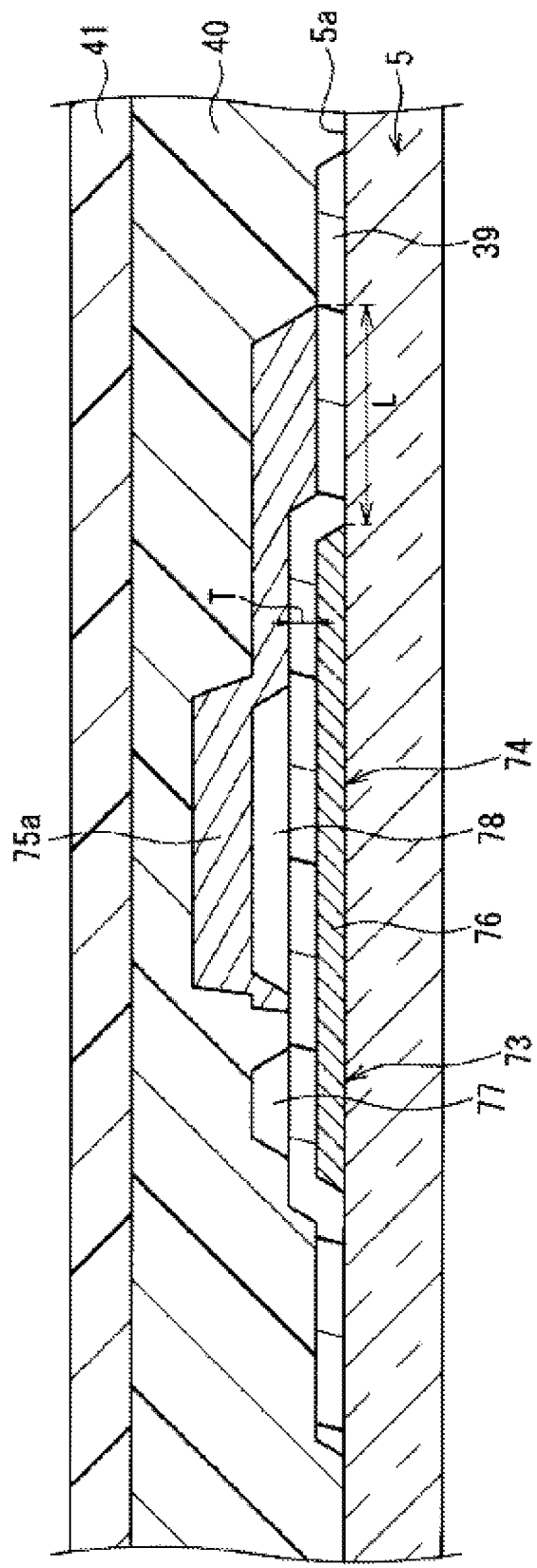
FIG. 17B is a cross-sectional drawing along the line XVIIb-XVIIb of FIG. 16.
Figure 17C:
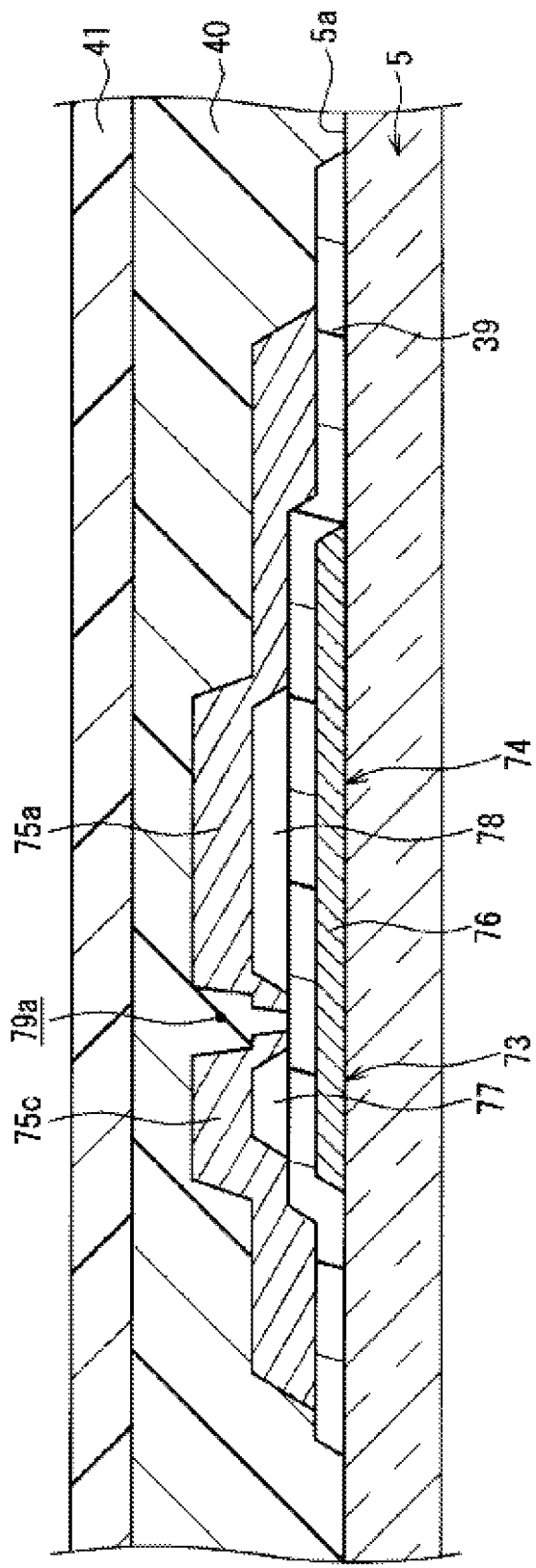
FIG. 17C is a cross-sectional drawing along the line XVIIc-XVIIc of FIG. 16.

FIG. 15 is a circuit diagram that shows an equivalent circuit of a memory cell according to Embodiment 4 of the present invention. FIG. 16 is a plan view layout drawing of the memory cell shown in FIG. 15. FIG. 17A is a cross-sectional drawing along the line XVIIa-XVIIa of FIG. 16. FIG. 17B is a cross-sectional drawing along the line XVIIb-XVIIb of FIG. 16. FIG. 17C is a cross-sectional drawing along the line XVIIc-XVIIc of FIG. 16. In the drawings, the main difference between the present embodiment and Embodiment 1 is that a floating gate electrode is provided below a semiconductor layer of a memory cell transistor and a semiconductor layer of a MOS capacitor. Elements that are in common with Embodiment 1 are given the same reference characters, and descriptions thereof are omitted.

In other words, as shown in FIG. 15, a memory cell (non-volatile memory) 72 of the present embodiment includes a memory cell transistor 73 and a MOS capacitor 74. In the memory cell 72, the control gate, the drain, and the source thereof are respectively connected to conductive wiring line layers 75a, 75b, and 75c as wiring line layers. In the memory cell 72, the control gate, the drain, and the source are respectively connected to a word line WL, a bit line BL, and a source line SL via the conductive wiring line layers 75a, 75b, and 75c. The conductive wiring line layers 75a, 75b, and 75c are configured so as to also function as shielding parts, as will be described below.

In the memory cell 72, the gate electrode of the memory cell transistor 73 and the gate electrode of the MOS capacitor 74 are shared as a floating gate electrode 76 in a floating state. The floating gate electrode 76 is provided below each semiconductor layer of the memory cell transistor 73 and the MOS capacitor 74, and constitutes a bottom gate electrode, as will be described below. In addition, in the memory cell 72, the floating gate electrode 76 constitutes a charge storage part that stores data corresponding to the amount of charge stored, and the floating gate electrode 76 is used as a memory storage part that stores data.

As shown in FIGS. 16 and 17A to 17C, in the memory cell 72, each of the parts of the memory cell transistor 73 and the MOS capacitor 74 are formed on a main surface 5a on an active matrix substrate 5.

Specifically, as shown in FIGS. 16 and 17A, in the memory cell transistor 73, the floating gate electrode 76 is formed on the main surface 5a of the active matrix substrate 5. An insulating film 39 is provided so as to cover the floating gate electrode 76, and a semiconductor layer 77 for which polysilicon is used, for example, is formed on the insulating film 39. A source region 77a of the semiconductor layer 77 is connected to the conductive wiring line layer 75c, and a drain region 77c of the semiconductor layer 77 is connected to the conductive wiring line layer 75b. A passivation insulating film 40 is provided so as to cover a channel region 77b of the semiconductor layer 77 and conductive wiring line layers 75b and 75c.

As shown in FIGS. 16, 17B, and 17C, in the MOS capacitor 74, a semiconductor layer 78 thereof is provided on the floating gate electrode 76 and the insulating film 39, which are formed on the main surface 5a of the active matrix substrate 5. Polysilicon is used, for example, for the semiconductor layer 78. The conductive wiring line layer 75a is provided so as to cover the semiconductor layer 78.

In the memory cell 72 of the present embodiment, a shielding part 79 that shields the floating gate electrode 76 is constituted of the conductive wiring line layers 75a to 75c so as to be provided between the floating gate electrode (memory storage part) 76, and the passivation insulating film 40 and the organic polymer film 41 (insulating film), and so as to prevent impurities from the passivation insulating film 40 and the organic polymer film 41 from reaching the floating gate electrode 76. In FIG. 16, the shielding part 79 is delimited by a rectangular region that surrounds the entirety of the conductive wiring line layers 75a to 75c.

The shielding part 79 is configured so as to fulfill the following inequality (1):

$$L/T \geq 5 \tag{1}$$

where L (FIGS. 16 and 17B) is a protruding dimension of the shielding part 79 with respect to the floating gate electrode (memory storage part) 76, and T (FIG. 17B) is a distance between the floating gate electrode 76 and the shielding part 79 in a perpendicular direction to the main surface 5a of the active matrix substrate 5.

In addition, the shielding part 79 is provided with openings 79a that are 5% to 20% of the shielding area. In other words, as shown in FIG. 16, in the shielding part 79, the slit shaped openings 79a are provided between the conductive wiring line layer 75a in a rectangular shape and each of the conductive wiring line layers 75b and 75c in a rectangular shape, and between the conductive wiring line layer 75b and the conductive wiring line layer 75c. The opening area of the openings 79a is set to be 5% to 20% of the shielding area of the shielding part 79.

With this configuration, functions and effects similar to Embodiment 1 can be attained with the present embodiment. In the present embodiment, the floating gate electrode 76 is provided below each of the semiconductor layers 77 and 78 of the memory cell transistor 73 and the MOS capacitor 74; thus, a bottom gate memory cell (non-volatile memory) 72 can be configured.

Besides what is described above, the memory cell 72 of the present embodiment can also be formed inside an active display region A (the same applies to Embodiment 5 below).

Embodiment 5

Figure 18:
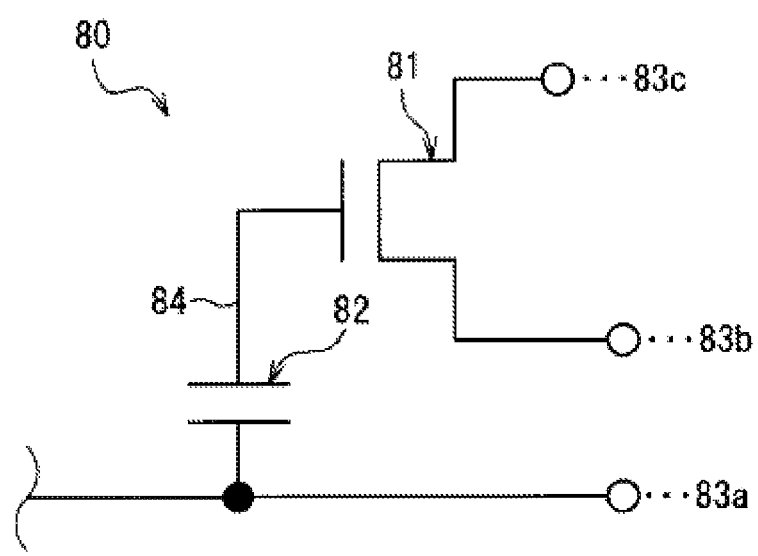
FIG. 18 is a circuit diagram that shows an equivalent circuit of a memory cell according to Embodiment 5 of the present invention.
Figure 19:
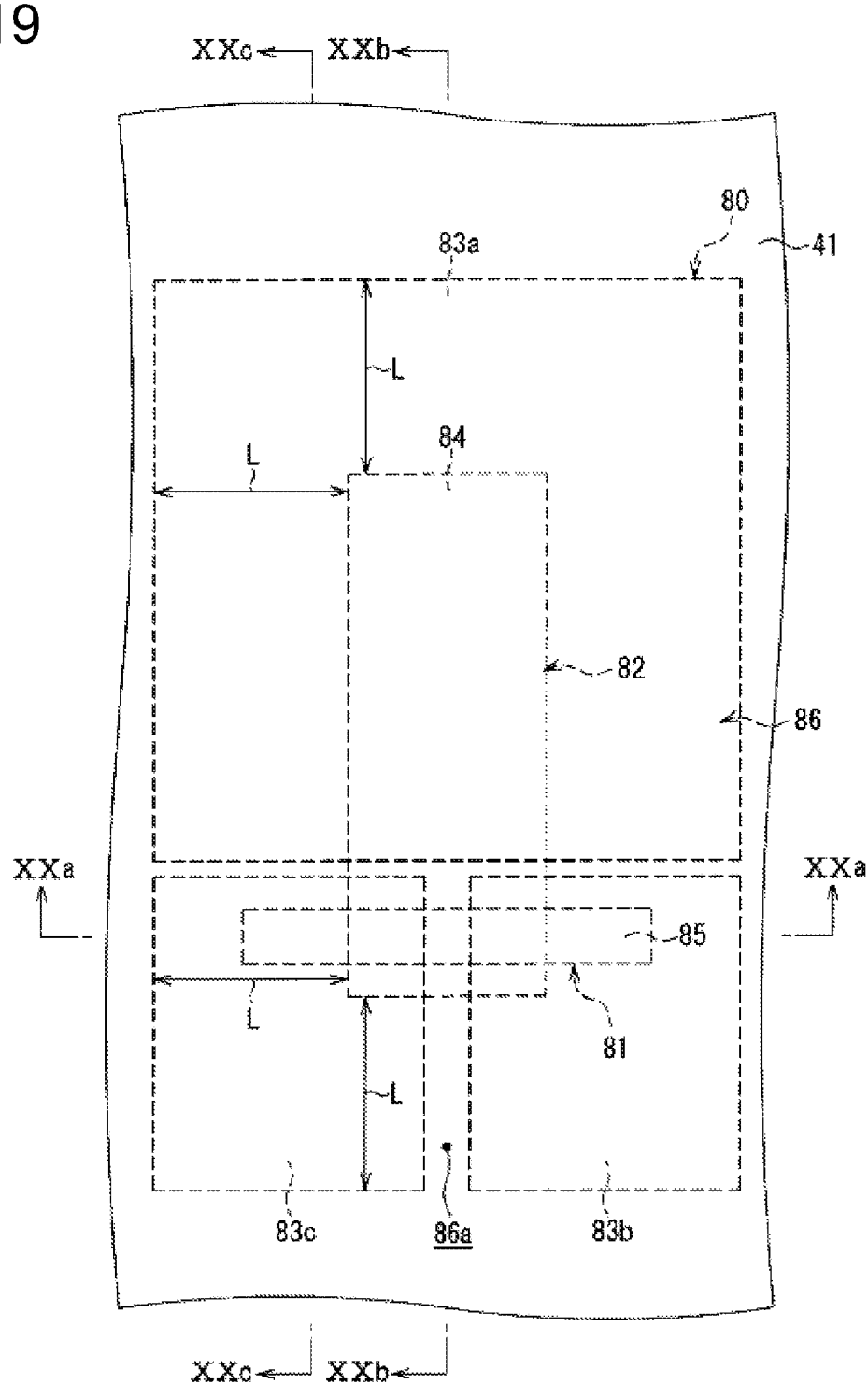
FIG. 19 is a plan view layout drawing of the memory cell shown in FIG. 18.
Figure 20A:
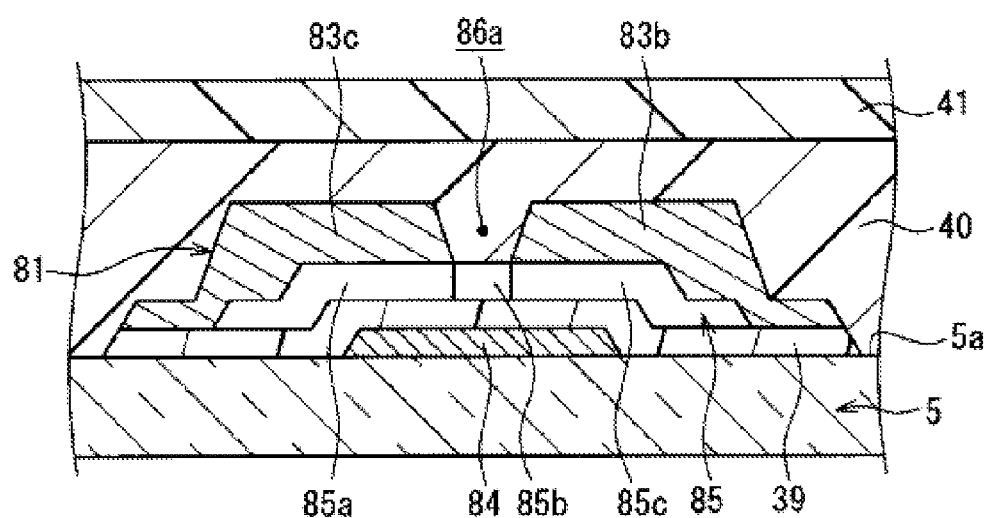
FIG. 20A is a cross-sectional drawing along the line XXa-XXa of FIG. 19.
Figure 20B:
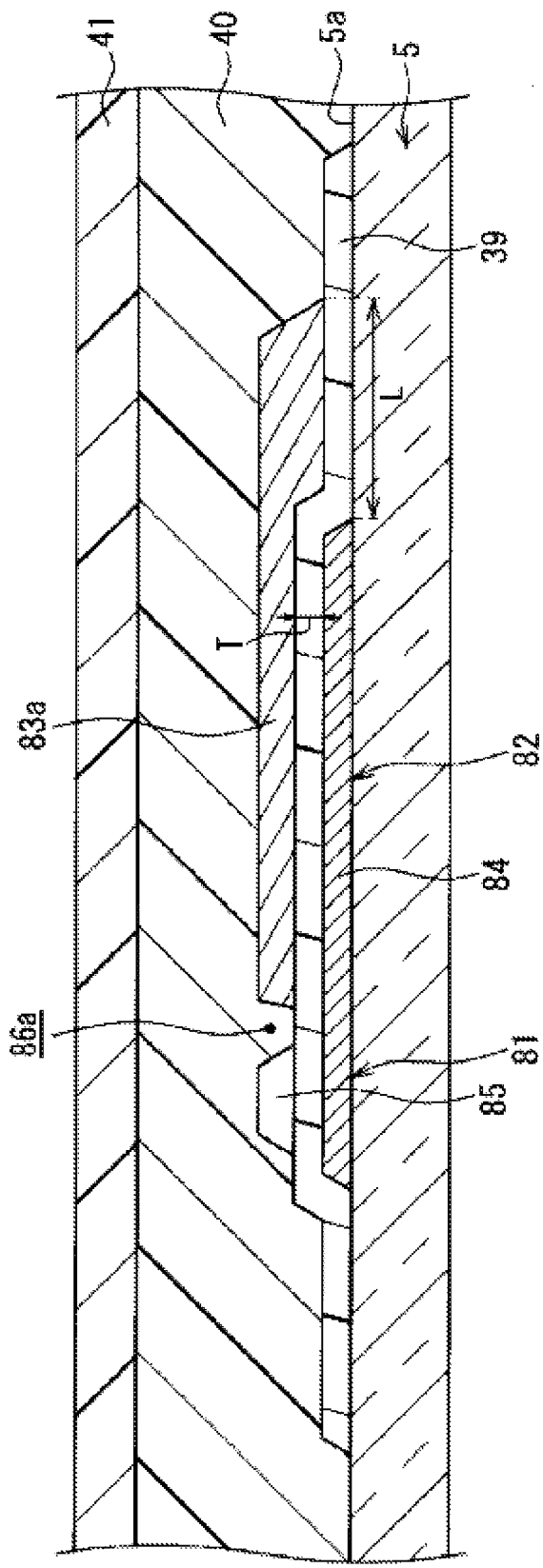
FIG. 20B is a cross-sectional drawing along the line XXb-XXb of FIG. 19.
Figure 20C:
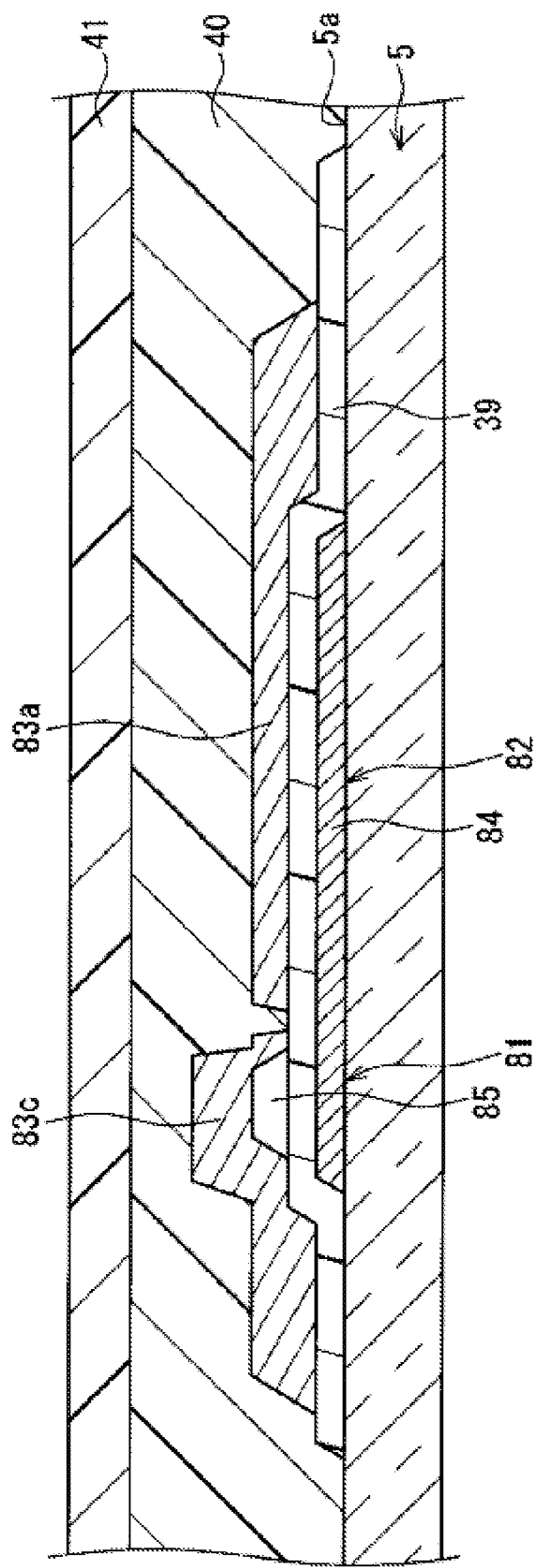
FIG. 20C is a cross-sectional drawing along the line XXc-XXc of FIG. 19.

FIG. 18 is a circuit diagram that shows an equivalent circuit of a memory cell according to Embodiment 5 of the present invention. FIG. 19 is a plan view layout drawing of the memory cell shown in FIG. 18. FIG. 20A is a cross-sectional drawing along the line XXa-XXa of FIG. 19. FIG. 20B is a cross-sectional drawing along the line XXb-XXb of FIG. 19. FIG. 20C is a cross-sectional drawing along the line XXc-XXc of FIG. 19. In the drawings, the main difference between the present embodiment and Embodiment 4 is that an inter-electrode capacitor is provided instead of a MOS capacitor and that a floating gate electrode and conductive wiring line layers connected to a control gate are capacitively coupled to each other in the inter-electrode capacitor. Elements that are in common with Embodiment 4 are given the same reference characters, and descriptions thereof are omitted.

In other words, as shown in FIG. 18, a memory cell (non-volatile memory) 80 of the present embodiment includes a memory cell transistor 81 and an inter-electrode capacitor 82. In the memory cell 80, the control gate, the drain, and the source thereof are respectively connected to conductive wiring line layers 83a, 83b, and 83c as wiring line layers. In the memory cell 80, the control gate, the drain, and the source are respectively connected to a word line WL, a bit line BL, and a source line SL via the conductive wiring line layers 83a, 83b, and 83c. The conductive wiring line layers 83a, 83b, and 83c are configured so as to also function as shielding parts, as will be described below.

In the memory cell 80, the gate electrode of the memory cell transistor 81 and the gate electrode of the inter-electrode capacitor 82 are shared as a floating gate electrode 84 in a floating state. The floating gate electrode 84 is provided below a semiconductor layer of the memory cell transistor 81, and constitutes a bottom gate electrode, as will be described below. In addition, in the memory cell 80, the floating gate electrode 84 constitutes a charge storage part that stores data corresponding to the amount of charge stored, and the floating gate electrode 84 is used as a memory storage part that stores data.

As shown in FIGS. 19 and 20A to 20C, in the memory cell 80, each of the parts of the memory cell transistor 81 and the inter-electrode capacitor 82 are formed on a main surface 5a of an active matrix substrate 5.

Specifically, as shown in FIGS. 19 and 20A, in the memory cell transistor 81, the floating gate electrode 84 is formed on the main surface 5a of the active matrix substrate 5. The insulating film 39 is provided so as to cover the floating gate electrode 84, and a semiconductor layer 85 for which polysilicon is used, for example, is formed on the insulating film 39. A source region 85a of the semiconductor layer 85 is connected to the conductive wiring line layer 83c, and the drain region 85c of the semiconductor layer 85 is connected to the conductive wiring line layer 83b. The passivation insulating film 40 is provided so as to cover a channel region 85b of the semiconductor layer 85 and the conductive wiring line layers 83b and 83c.

As shown in FIGS. 19, 20B, and 20C, in the inter-electrode capacitor 82, the floating gate electrode 84 is formed on the main surface 5a of the active matrix substrate 5.

The floating gate electrode 84 is covered by the insulating film 39, and is also covered by the conductive wiring line layer 83a provided on the insulating film 39. In the inter-electrode capacitor 82, the conductive wiring line layer 83a and the floating gate electrode 84 are capacitively coupled to each other.

In the memory cell 80 of the present embodiment, a shielding part 86 that shields the floating gate electrode 84 is constituted of the conductive wiring line layers 83a to 83c so as to be provided between the floating gate electrode (memory storage part) 84, and the passivation insulating film 40 and the organic polymer film 41 (insulating part) and so as to prevent impurities from the passivation insulating film 40 and the organic polymer film 41 from reaching the floating gate electrode 84. In FIG. 19, the shielding part 86 is delimited by a rectangular region that surrounds the entirety of the conductive wiring line layers 83a to 83c.

The shielding part 86 is configured so as to fulfill the following inequality (1):

$$L/T \geq 5 \qquad (1),$$

where L (FIGS. 19 and 20B) is a protruding dimension of the shielding part 86 with respect to the floating gate electrode (memory storage part) 84, and T (FIG. 20B) is a distance between the floating gate electrode 84 and the shielding part 86 in a perpendicular direction to the main surface 5a of the active matrix substrate 5.

In addition, the shielding part 86 is provided with openings 86a that are 5% to 20% of the shielding area. In other words, as shown in FIG. 19, in the shielding part 86, the slit shaped openings 86a are provided between the conductive wiring line layer 83a in a rectangular shape, and each of the conductive wiring line layers 83b and 83c in a rectangular shape, and between the conductive wiring line layer 83b and the conductive wiring line layer 83c. The opening area of the opening 86a is set to be 5% to 20% of the shielding area of the shielding part 86.

With this configuration, functions and effects similar to Embodiment 4 can be attained with the present embodiment. Also, in the present embodiment, in the inter-electrode capacitor 82, the conductive wiring line layer 83a and the floating gate electrode 84 are capacitively coupled to each other; thus, an easy-to-manufacture bottom gate memory cell (non-volatile memory) 80 with a simplified structure can be configured.

Embodiment 6

Figure 21:
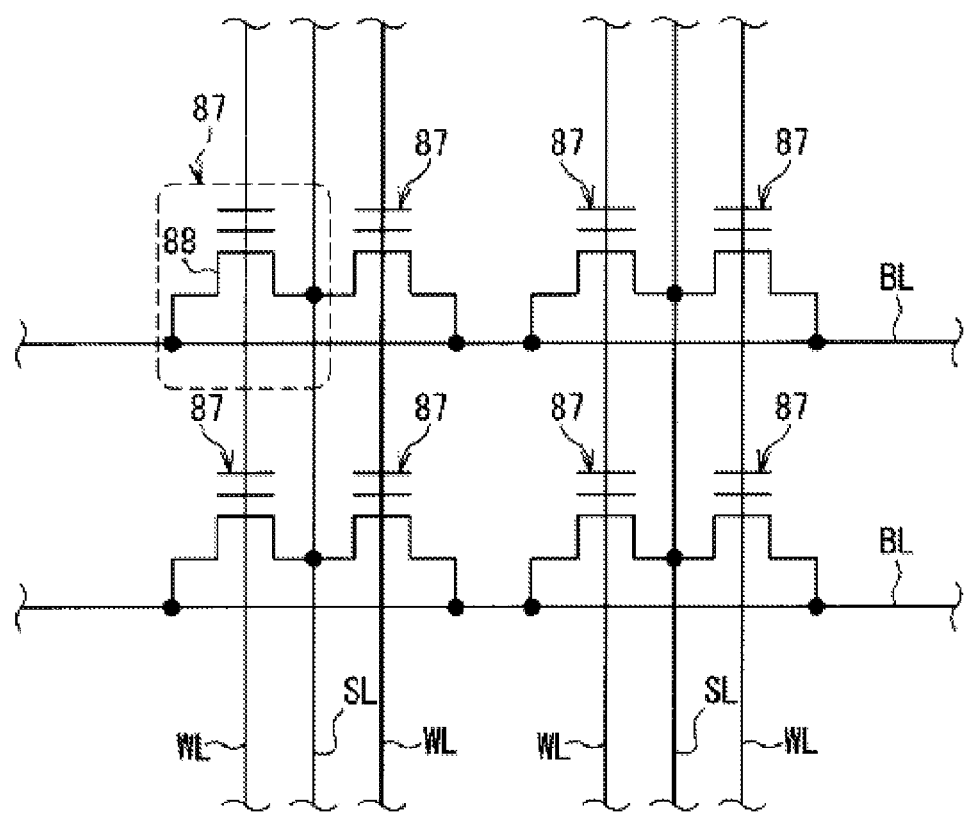
FIG. 21 is a circuit diagram that shows an equivalent circuit of a semiconductor device according to Embodiment 6 of the present invention.
Figure 22:
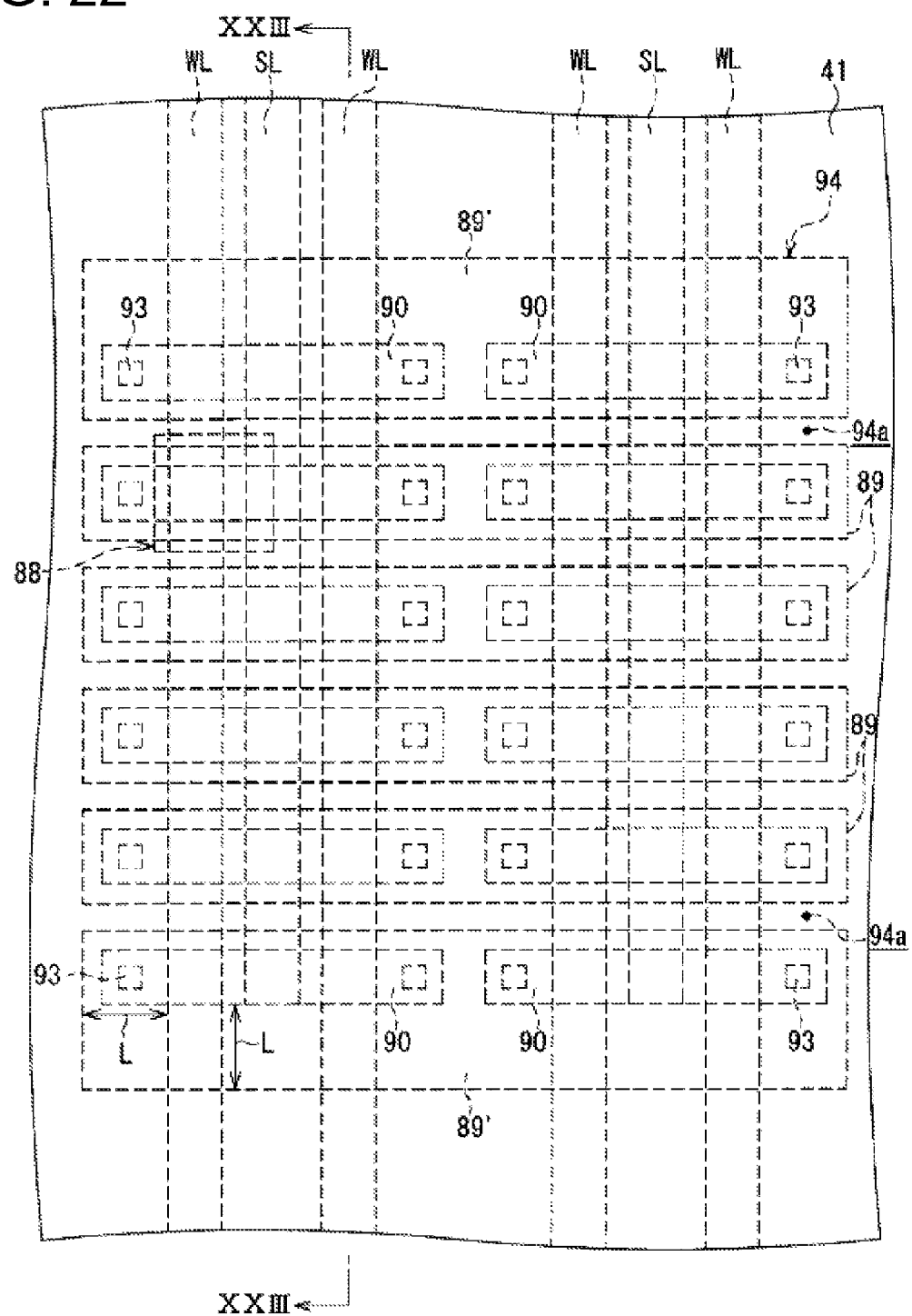
FIG. 22 is a plan view layout drawing of a memory cell array shown in FIG. 21.
Figure 23:
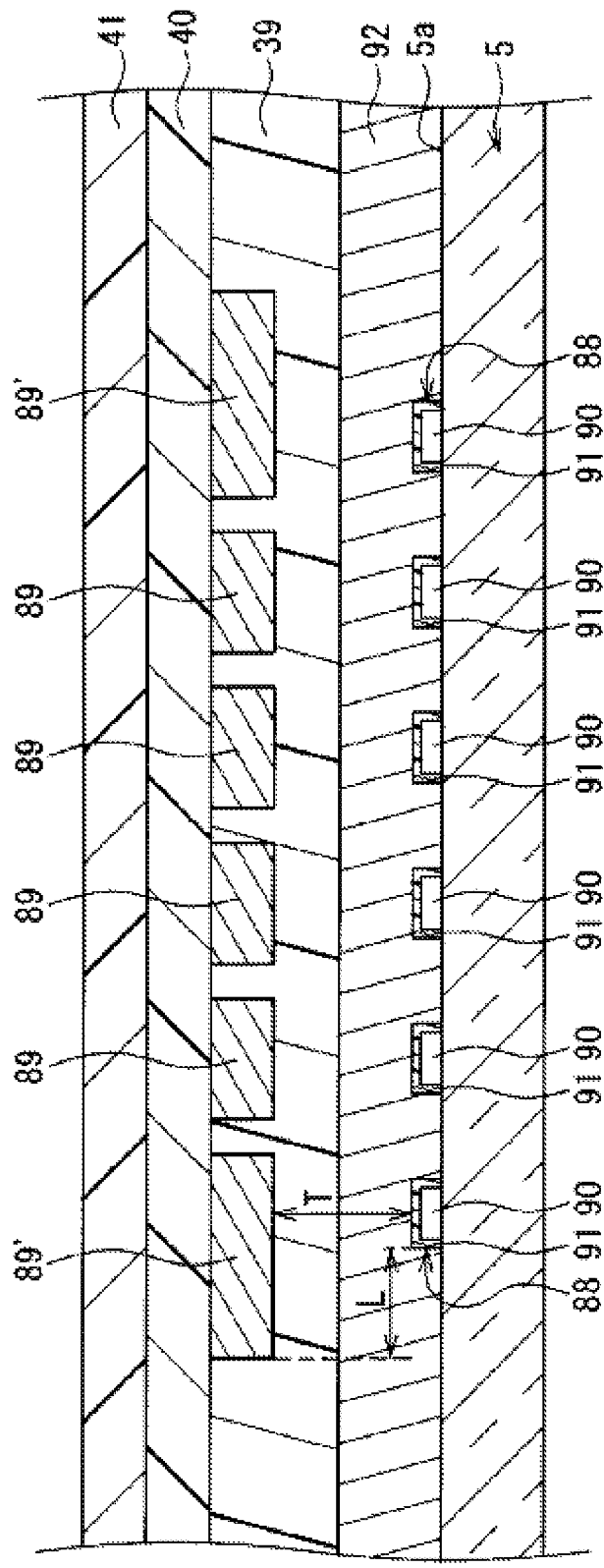
FIG. 23 is a cross-sectional drawing along the line XXIII-XXIII of FIG. 22.

FIG. 21 is a circuit diagram that shows an equivalent circuit of a semiconductor device according to Embodiment 6 of the present invention. FIG. 22 is a plan view layout drawing of a memory cell array shown in FIG. 21. FIG. 23 is a cross-sectional drawing along the line XXIII-XXIII of FIG. 22. In the drawings, the main difference between the present embodiment and Embodiment 3 is that two trap insulating films are provided for each semiconductor layer, and that the semiconductor layer is shared as a semiconductor layer of two memory cell transistors. Elements that are in common with Embodiment 3 are given the same reference characters, and descriptions thereof are omitted.

In other words, as shown in FIG. 21, in the present embodiment, a matrix form memory cell array is provided such that two memory cells 87 form one group. Each memory cell 87 includes a memory cell transistor 88. Additionally, in the present embodiment, a control gate is connected to a word line WL via a gate electrode that will be described below, and a drain is connected to a bit line BL via conductive wiring line layers that will be explained below, in a memory cell transistor 88. In the present embodiment, each source of the two memory cell transistors 88 is connected to one shared source line SL.

The conductive wiring line layers are configured to also function as shielding parts, as will be described below.

As shown in FIGS. 22 and 23, in the memory cell 87, each of the parts of the memory cell transistor 88 are formed on a main surface 5a of an active matrix substrate 5. In the memory cell 87, a trap insulating film 91 is provided between a semiconductor layer 90 of the memory cell transistor 88 and a gate electrode 92. In the memory cell 87, the trap insulating film 91 constitutes a charge storage part that stores data corresponding to the amount of charge stored, and the trap insulating film 91 is used as a memory storage part that stores data. In the memory cell 87, two trap insulating films 91 are provided for each semiconductor layer 90, and the semiconductor layer 90 is shared as a semiconductor layer of two memory cell transistors 88.

Specifically, as shown in FIGS. 22 and 23, in the memory cell transistor 88, the semiconductor layer 90 thereof is formed on the main surface 5a of the active matrix substrate 5. Polysilicon is used, for example, for the semiconductor layer 90. A source region of the semiconductor layer 90 is connected to a source line SL, and the drain region of the semiconductor layer 90 is connected to a conductive wiring line layer 89 or 89' via a contact hole 93. In a channel region of the semiconductor layer 90, the trap insulating film 91 and the gate electrode 92 are formed in this order. The conductive wiring line layer 89 or 89' is provided so as to cover the trap insulating film 91. The conductive wiring line layer 89' is configured so as to be bigger than the conductive wiring line layer 89, and a protruding dimension that will be described below is at a prescribed quantity.

In the memory cell 87 of the present embodiment, a shielding part 94 that shields the trap insulating film 91 is constituted of the conductive wiring line layers 89 and 89' so as to be provided between the trap insulating films (memory storage parts) 91, and the passivation insulating film 40 and the organic polymer film 41 (insulating layer), and so as to prevent impurities from the passivation insulating film 40 and the organic polymer film 41 from reaching the trap insulating films 91. In FIG. 22, the shielding part 94 is delimited by a rectangular region that surrounds the entirety of the conductive wiring line layers 89 and 89'.

The shielding part 94 is configured so as to fulfill the following inequality (1):

$$L/T \geq 5 \qquad (1),$$

where L (FIGS. 22 and 23) is a protruding dimension of the shielding part 94 with respect to the trap insulating film (memory storage part) 91, and T (FIG. 23) is a distance between the trap insulating film 91 and the shielding part 94 in a perpendicular direction to the main surface 5a of the active matrix substrate 5.

In addition, the shielding part 94 is provided with openings 94a that are 5% to 20% of the shielding area. In other words, in the shielding part 94, the slit shaped openings 94a are provided between each of the conductive wiring line layers 89 and 89' in a rectangular shape, as shown in FIG. 22. The opening area of the openings 94a is set to be 5% to 20% of the shielding area of the shielding part 94.

With this configuration, functions and effects similar to Embodiment 3 can be attained with the present embodiment. In the present embodiment, two trap insulating films 91 are provided for each semiconductor layer 90, and the semiconductor layer 90 is shared as a semiconductor layer of two memory cell transistors 88. As a result, with the present embodiment, miniaturization of a semiconductor device provided with a plurality of memory cells (non-volatile memory) 87 can be easily accomplished.

Embodiment 7

Figure 24:
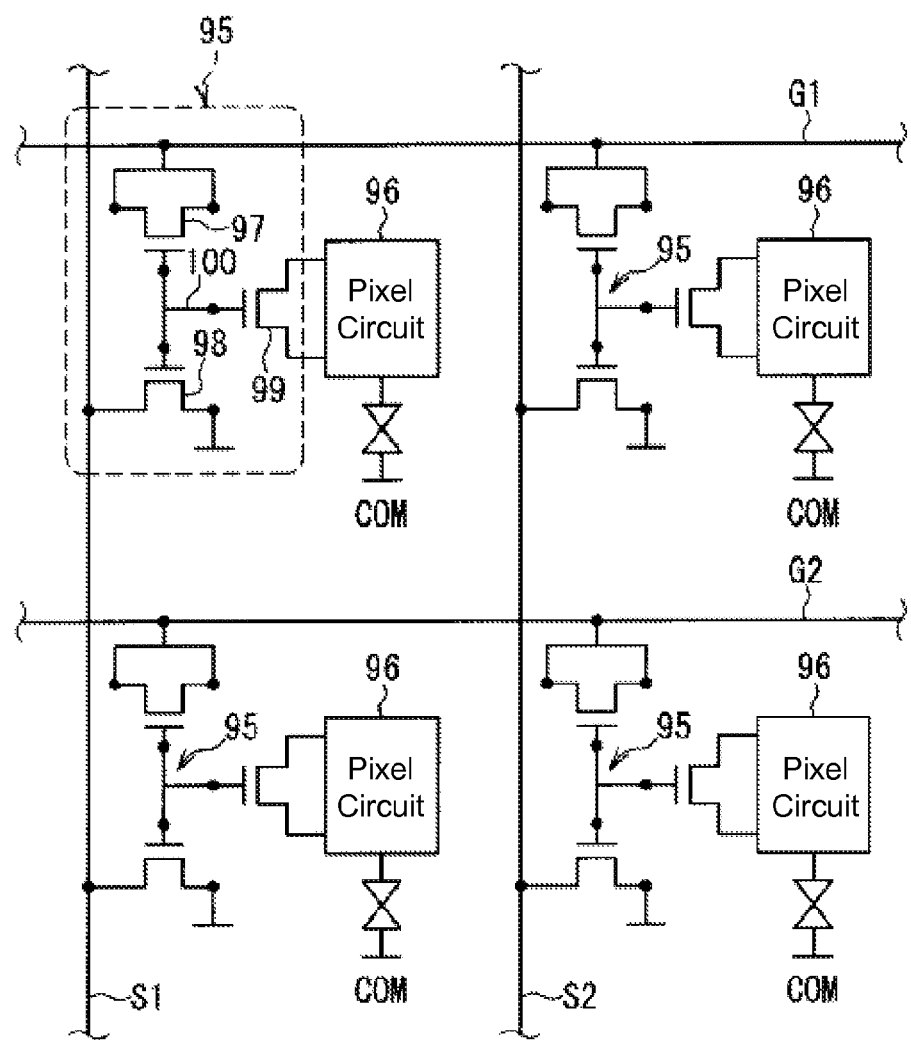
FIG. 24 is a drawing that describes the configuration of the main parts of a liquid crystal display device using a semiconductor device according to Embodiment 7 of the present invention.

FIG. 24 is a drawing that describes a configuration of the main parts of a liquid crystal display device using a semiconductor device according to Embodiment 7 of the present invention. In the drawing, the main difference between the present embodiment and Embodiment 1 is that a memory cell is provided per pixel unit of the liquid crystal panel. Elements that are in common with Embodiment 1 are given the same reference characters, and descriptions thereof are omitted.

In other words, as shown in FIG. 24, in a liquid crystal display device 1 of the present embodiment, a memory cell (non-volatile memory) 95 is provided for each pixel P formed on an active matrix substrate 5. Specifically, as shown in FIG. 24, the memory cell 95 is provided at each intersection of source wiring lines 51 and S2 and gate wiring lines G1 and G2, which are provided in a liquid crystal panel 2. A pixel circuit 96, which controls the liquid crystal pixel voltage, is connected to the memory cell 95, and the liquid crystal display device 1 of the present embodiment is configured such that a voltage corresponding to the memory state of the memory cell 95 is outputted to the pixel electrode 19 (FIG. 2) via the pixel circuit 96.

Specifically, the memory cell 95 of the present embodiment includes a MOS capacitor 97, a writing memory cell transistor 98, and a reading memory cell transistor 99. In the memory cell 95, the gate electrode of the MOS capacitor 97, the gate electrode of the writing memory cell transistor 98, and the gate electrode of the reading memory cell transistor 99 are shared as a floating gate electrode 100, which is in a floating state. In addition, in the memory cell 95, the floating gate electrode 100 constitutes a charge storage part that stores data corresponding to the amount of charge stored, and is used as a memory storage part that stores data.

The other terminals of the MOS capacitors 97 (the terminal on the opposite side to the floating gate electrode 100) are connected to the gate wiring lines G1 and G2. The drains of the writing memory cell transistors 98 are connected to the source wiring lines S1 and S2, and the sources of the writing memory cell transistors 98 are connected to the ground line. The reading memory cell transistor 99 is connected to the pixel circuit 96. In the memory cell 95, a voltage corresponding to data stored in the floating gate electrode 100 is outputted to the pixel circuit 96.

With this configuration, functions and effects similar to Embodiment 1 can be attained with the present embodiment. In the present embodiment, a memory cell (non-volatile memory) 95 is provided per pixel unit, and therefore, a high performance liquid crystal display device 1 that can store a large amount of data can be easily configured.

Aside from the above description, a configuration in which a control circuit such as a reversal circuit for a liquid crystal voltage or a control circuit for overwriting the memory cell 95 is provided may be used, for example. Also, a memory cell that can read data can be connected to the pixel circuit 96.

All of the above-mentioned embodiments are illustrative and not limiting. The technical scope of the present invention is defined by the claims, and any modifications within a scope that corresponds to the configurations stated in the claims and their equivalents are also encompassed by the present invention.

In the above description, for example, a description was made of an example in which the present invention was applied to an active matrix substrate of a liquid crystal display device. However, as long as the semiconductor device of the present invention includes: a substrate; a non-volatile memory that has a switching element provided on a main surface of the substrate and a memory storage part provided on the main surface of the substrate and that stores data; an insulating layer above the non-volatile memory; and a shielding part that is provided between the memory storage part and the insulating layer and that shields the memory storage part such that impurities from the insulating layer are prevented from reaching the memory storage part, there are no limits.

Specifically, the present invention can be applied to various types of display devices such as transflective or reflective liquid crystal panels, organic EL (electronic luminescence) elements, inorganic EL elements, field emission displays, an active matrix substrate used therein, and the like.

In the above description, a case in which a floating gate electrode (charge storage part) or a trap insulating film (charge storage part) that stores data corresponding to the amount of charge stored is used as a memory storage part was described, but the memory storage part of the present invention is not limited to this; a memory storage part that stores data corresponding to a dielectric polarization state, or a memory storage part that stores data corresponding to changes in resistance, for example, can be used.

In the above description, a configuration in which a conductive wiring line layer (wiring line layer) that is connected to a non-volatile memory such as a memory cell transistor (switching element) is used as a shielding part was described, but the shielding part of the present invention is not limited to this as long as it shields the memory storage part so as to prevent impurities from the insulating layer from reaching the memory storage part. Therefore, a shielding part that is configured separately from the wiring line layer can be used.

However, a case in which a conductive wiring line layer is used as the shielding part and a floating gate electrode (charge storage part) or a trap insulating film (charge storage part) is used as the memory storage part, as in each of the above-mentioned embodiments, allows a compact semiconductor device with a simple structure to be easily configured, and is therefore preferable.

In the above description, cases in which a passivation insulating film and an organic polymer film are used as the insulating layer were described, but the insulating layer of the present invention is not limited to this, and an insulating layer in which a plurality of organic polymer films are laminated, for example, can be used.

INDUSTRIAL APPLICABILITY

The present invention is useful as a semiconductor device that can maintain the storability of data, and an active matrix substrate and a display device that use the same.

DESCRIPTION OF REFERENCE CHARACTERS

1 liquid crystal display device (display device)
2 liquid crystal panel (display part)
5 active matrix substrate (substrate)
5*a* main surface
21, 47, 62, 72, 80, 87, 95 memory cell (non-volatile memory)
33, 63, 73, 81, 88 memory cell transistor (switching element)
34, 50, 74, 97 MOS capacitor 35a, 35b, 35c, 51a, 51b, 51c, 51d, 51e, 64a, 64b, 64c, 75a, 75b, 75c, 83a, 83b, 83c, 89, 89' conductive wiring line layer (shielding part, wiring line layer)
36, 52, 76, 84, 100 floating gate electrode (memory storage part, charge storage part)
40 passivation insulating film (insulating layer)
41 organic polymer film (insulating layer)
44, 59, 78 semiconductor layer (of MOS capacitor)
46, 61, 71, 79, 86, 94 shielding part
46a, 61a, 71a, 79a, 86a, 94a opening
48, 99 reading memory cell transistor
49, 98 writing memory cell transistor
65, 77, 85, 90 semiconductor layer (of memory cell transistor)
66, 92 gate electrode (of memory cell transistor)
67, 91 trap insulating film (memory storage part, charge storage part)
82 inter-electrode capacitor

The invention claimed is:

1. A semiconductor device, comprising:
a substrate;
a non-volatile memory comprising a memory cell transistor and an inter-electrode capacitor,
wherein the memory cell transistor is provided on a main surface of the substrate and wherein the inter-electrode capacitor comprises a memory storage part provided on the main surface of the substrate to store data;
an insulating layer provided above the non-volatile memory; and
a shielding part provided between the memory storage part and the insulating layer, the shielding part being provided to shield the memory storage part such that impurities from the insulating layer are prevented from reaching the memory storage part,
wherein a gate electrode of the memory cell transistor and a gate electrode of the inter-electrode capacitor are provided below a semiconductor layer of the memory cell transistor, and are shared as a floating gate electrode in a floating state, and the floating gate electrode is used as the memory storage part, and
wherein, in the inter-electrode capacitor, the floating gate electrode and a conductive wiring line layer connected to a control gate of the non-volatile memory are capacitively coupled to each other.

2. The semiconductor device according to claim 1, wherein the following inequality (1) is fulfilled:

$$L/T \geq 5 \qquad (1),$$

where L is a protruding dimension of the shielding part with respect to the memory storage part, and T is a distance between the memory storage part and the shielding part in a perpendicular direction to the main surface of the substrate.

3. The semiconductor device according to claim 1, wherein the shielding part is provided with an opening that is 5% to 20% of a shielding area.

4. The semiconductor device according to claim 1, wherein a wiring line layer connected to the non-volatile memory is used as the shielding part, and
wherein a charge storage part that stores data corresponding to the amount of charge stored is used as the memory storage part.

5. An active matrix substrate, comprising the semiconductor device according to claim 1.

6. A display device, comprising:
a display part that displays data; and
the semiconductor device according to claim 1.

7. The display device according to claim 6, wherein a liquid crystal panel is used as the display part.

8. The display device according to claim 7, wherein a non-volatile memory is provided per pixel unit of the liquid crystal panel.

* * * * *